United States Patent
Maruyama et al.

(10) Patent No.: US 7,648,862 B2
(45) Date of Patent: *Jan. 19, 2010

(54) SEMICONDUCTOR DEVICE AND METHOD OF MANUFACTURING THE SAME

(75) Inventors: Junya Maruyama, Kanagawa (JP); Toru Takayama, Kanagawa (JP); Yuugo Goto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/743,695

(22) Filed: May 3, 2007

(65) Prior Publication Data

US 2007/0212853 A1  Sep. 13, 2007

Related U.S. Application Data

(63) Continuation of application No. 10/283,223, filed on Oct. 30, 2002, now Pat. No. 7,332,381.

(30) Foreign Application Priority Data

Oct. 30, 2001  (JP) ............................. 2001-333565

(51) Int. Cl.
*H01L 21/00* (2006.01)
(52) U.S. Cl. .................. 438/149; 438/455; 438/458; 257/E27.111; 257/E29.295
(58) Field of Classification Search ......... 438/455–459, 438/149–167; 257/E21.122, E27.111, E29.295
See application file for complete search history.

(56) References Cited

U.S. PATENT DOCUMENTS 4,722,765 A  2/1988  Ambros (Continued)

FOREIGN PATENT DOCUMENTS

CN  1256794  6/2000

(Continued)

OTHER PUBLICATIONS

Takayama et al., "A CPU on a Plastic Film Substrate," *2004 Symposium on VLSI Technology, Digest of Technical Papers*, Jun. 2004, pp. 230-231.

*Primary Examiner*—Brook Kebede
(74) *Attorney, Agent, or Firm*—Fish & Richardson P.C.

(57) ABSTRACT

A semiconductor device having a semiconductor element (a thin film transistor, a thin film diode, a photoelectric conversion element of silicon PIN junction, or a silicon resistor element) which is light-weight, flexible (bendable), and thin as a whole is provided as well as a method of manufacturing the semiconductor device. In the present invention, the element is not formed on a plastic film. Instead, a flat board such as a substrate is used as a form, the space between the substrate (third substrate (17)) and a layer including the element (peeled layer (13)) is filled with coagulant (typically an adhesive) that serves as a second bonding member (16), and the substrate used as a form (third substrate (17)) is peeled off after the adhesive is coagulated to hold the layer including the element (peeled layer (13)) by the coagulated adhesive (second bonding member (16)) alone. In this way, the present invention achieves thinning of the film and reduction in weight.

26 Claims, 18 Drawing Sheets

U.S. PATENT DOCUMENTS

| | | | |
|---|---|---|---|
| 5,206,749 A | 4/1993 | Zavracky | |
| 5,258,325 A | 11/1993 | Spitzer | |
| 5,317,236 A | 5/1994 | Zavracky | |
| 5,341,015 A | 8/1994 | Kohno | |
| 5,376,561 A | 12/1994 | Vu | |
| 5,397,713 A | 3/1995 | Hamamoto | |
| 5,654,811 A | 8/1997 | Spitzer | |
| 5,674,304 A | 10/1997 | Fukada | |
| 5,757,456 A | 5/1998 | Yamazaki | |
| 5,781,164 A | 7/1998 | Jacobsen | |
| 5,807,440 A | 9/1998 | Kubota | |
| 5,815,223 A | 9/1998 | Watanabe et al. | |
| 5,821,138 A | 10/1998 | Yamazaki | |
| 5,851,862 A | 12/1998 | Ohtani | |
| 5,879,741 A | 3/1999 | Itoh | |
| 5,929,961 A | 7/1999 | Nishi | |
| 6,033,974 A | 3/2000 | Henley | |
| 6,043,800 A | 3/2000 | Spitzer | |
| 6,059,913 A | 5/2000 | Asmussen | |
| 6,100,166 A | 8/2000 | Sakaguchi | |
| 6,118,502 A | 9/2000 | Yamazaki | |
| 6,127,199 A | 10/2000 | Inoue | |
| 6,221,738 B1 | 4/2001 | Sakaguchi | |
| 6,261,634 B1 | 7/2001 | Itoh | |
| 6,268,695 B1 | 7/2001 | Affinito | |
| 6,294,478 B1 * | 9/2001 | Sakaguchi et al. | 438/753 |
| 6,310,362 B1 | 10/2001 | Takemura | |
| 6,320,640 B2 | 11/2001 | Nishi | |
| 6,362,866 B1 | 3/2002 | Yamazaki | |
| 6,372,608 B1 | 4/2002 | Shimoda | |
| 6,376,333 B1 | 4/2002 | Yamazaki | |
| 6,391,220 B1 | 5/2002 | Zhang | |
| 6,423,614 B1 | 7/2002 | Doyle | |
| 6,448,152 B1 | 9/2002 | Henley | |
| 6,486,041 B2 | 11/2002 | Henley | |
| 6,492,026 B1 | 12/2002 | Graff | |
| 6,506,664 B1 * | 1/2003 | Beyne et al. | 438/455 |
| 6,521,511 B1 * | 2/2003 | Inoue et al. | 438/458 |
| 6,544,430 B2 | 4/2003 | McCormack | |
| 6,572,780 B2 | 6/2003 | McCormack | |
| 6,627,518 B1 | 9/2003 | Inoue et al. | |
| 6,645,830 B2 | 11/2003 | Shimoda | |
| 6,664,169 B1 | 12/2003 | Iwasaki | |
| 6,682,990 B1 | 1/2004 | Iwane | |
| RE38,466 E | 3/2004 | Inoue | |
| 6,700,631 B1 | 3/2004 | Inoue | |
| 6,737,285 B2 | 5/2004 | Iketani | |
| 6,774,010 B2 | 8/2004 | Chu | |
| 6,781,152 B2 | 8/2004 | Yamazaki | |
| 6,784,113 B2 | 8/2004 | Hembree | |
| 6,790,747 B2 | 9/2004 | Henley | |
| 6,802,926 B2 | 10/2004 | Mizutani | |
| 6,815,240 B2 | 11/2004 | Hayashi | |
| 6,818,530 B2 | 11/2004 | Shimoda | |
| 6,875,671 B2 | 4/2005 | Faris | |
| 6,878,607 B2 | 4/2005 | Inoue et al. | |
| 6,885,389 B2 | 4/2005 | Inoue | |
| 7,094,665 B2 | 8/2006 | Shimoda et al. | |
| 7,229,900 B2 * | 6/2007 | Takayama et al. | 438/458 |
| 7,332,381 B2 * | 2/2008 | Maruyama et al. | 438/149 |
| 2001/0004121 A1 | 6/2001 | Sakama | |
| 2001/0022362 A1 | 9/2001 | Hayashi | |
| 2001/0040645 A1 | 11/2001 | Yamazaki | |
| 2002/0004250 A1 | 1/2002 | Iketani | |
| 2002/0004292 A1 | 1/2002 | Yamazaki | |
| 2002/0030189 A1 | 3/2002 | Ishikawa | |
| 2002/0048864 A1 | 4/2002 | Yamazaki | |
| 2002/0106522 A1 | 8/2002 | McCormack | |
| 2002/0117256 A1 | 8/2002 | McCormack | |
| 2002/0146893 A1 | 10/2002 | Shimoda | |
| 2003/0008437 A1 | 1/2003 | Inoue | |
| 2003/0024635 A1 | 2/2003 | Utsunomiya | |
| 2003/0025118 A1 | 2/2003 | Yamazaki | |
| 2003/0032210 A1 | 2/2003 | Takayama | |
| 2003/0040164 A1 | 2/2003 | Inoue et al. | |
| 2003/0047280 A1 | 3/2003 | Takayama | |
| 2003/0064569 A1 | 4/2003 | Takayama | |
| 2003/0082889 A1 | 5/2003 | Maruyama | |
| 2003/0162312 A1 | 8/2003 | Takayama | |
| 2003/0217805 A1 | 11/2003 | Takayama et al. | |
| 2003/0224582 A1 | 12/2003 | Shimoda | |
| 2004/0087110 A1 | 5/2004 | Takayama | |
| 2004/0219762 A1 | 11/2004 | Shimoda | |
| 2004/0232413 A1 | 11/2004 | Yamazaki et al. | |
| 2005/0017255 A1 | 1/2005 | Yamazaki | |

FOREIGN PATENT DOCUMENTS

| | | |
|---|---|---|
| CN | 1312590 | 9/2001 |
| CN | 1332471 | 1/2002 |
| EP | 0 858 110 | 8/1998 |
| EP | 0924769 | 6/1999 |
| EP | 1 014 452 | 6/2000 |
| EP | 1 122 794 | 8/2001 |
| EP | 1 351 308 | 10/2003 |
| JP | 01-184957 | 7/1989 |
| JP | 05-347186 | 12/1993 |
| JP | 10-125929 | 5/1998 |
| JP | 10-125930 | 5/1998 |
| JP | 10-125931 | 5/1998 |
| JP | 11-020360 | 1/1999 |
| JP | 11-243209 | 9/1999 |
| JP | 2000-040812 | 2/2000 |
| JP | 2001-051296 | 2/2001 |
| JP | 2001-85154 | 3/2001 |
| JP | 2001-155134 | 6/2001 |
| JP | 2001-189460 | 7/2001 |
| JP | 2001-267578 | 9/2001 |
| JP | 3238223 | 12/2001 |
| JP | 2002-184959 | 6/2002 |
| JP | 2002-328624 | 11/2002 |
| WO | WO 92/12453 | 7/1992 |
| WO | WO 99/44242 | 9/1999 |

* cited by examiner

SEMICONDUCTOR DEVICE AND METHOD OF MANUFACTURING THE SAME

BACKGROUND OF THE INVENTION

1. Field of the Invention

The present invention relates to a semiconductor device having a circuit consisted of a thin film transistor (hereinafter, referred to as TFT) and a method of manufacturing the semiconductor device. For example, the present invention relates to an electro-optic device that is represented by a liquid crystal module, a light emitting device that is represented by an electroluminescence display device and an electronic device on which such a device is mounted as a part.

It should be noted that in the present specification, the term "semiconductor device" indicates a device in general capable of functioning by utilizing the semiconductor characteristics, and an electro-optic device, a light emitting device, a semiconductor circuit and an electronic equipment are all semiconductor devices.

2. Related Art

In recent years, a technology constituting a thin film transistor (TFT) using a semiconductor thin film (in the range from about a few nm to a few hundreds nm in thickness) formed on the substrate having an insulating surface has drawn attention. A thin film transistor is widely applied to electronic devices such as an IC, an electro-optic device or the like, and particularly, there is an urgent need to be developed as a switching element for an image display device.

Although as for applications utilizing such an image display device, a variety of applications are expected, particularly, its utilization for portable apparatuses has drawn the attention. At present, although many glass substrates and quartz substrates are utilized, there are defaults of being easily cracked and heavy. Moreover, the glass substrates and quartz substrates are difficult to be made larger in terms of conducting a mass-production, and these are not suitable for that. Therefore, the attempt that a TFT element is formed on a substrate having flexibility, representatively, on a flexible plastic film has been performed.

However, since the heat resistance of a plastic film is low, it cannot help lowering the highest temperature of the process: As a result, at present, a TFT is formed which has not so excellent electric characteristics compared with those formed on the glass substrates. Therefore, a liquid crystal display device and light emitting element having a high performance by utilizing a plastic film have not been realized yet.

If a liquid crystal display device or a light emitting device having an organic light emitting device (OLED) can be formed over a flexible substrate such as a plastic film, it can be obtained as a thin light-weight device and can be used in a display having a curved surface, a show window, etc. Use of such a device is not limited to use as a portable device, and the range of uses of such a device is markedly wide.

Moreover, since the transparency of plastic film to the light is lower than that of glass substrate, it is not based on the quality of the material and thickness of a plastic film which pass light, but there is also a problem that the transparency become worse slightly.

SUMMARY OF THE INVENTION

An object of the present invention is to provide the semiconductor equipment which is formed by semiconductor elements having thin film thickness, a light-weight and flexible (curving is possible) (thin film transistor, a memory element, a thin film diode, the photoelectric conversion element and silicon resistance element that consists of PIN junction of silicone), and its production method.

In the present invention, the element is not formed on a plastic film. Instead, the present invention is characterized in that a flat board like a substrate is used as a form, the space between the substrate and a layer including the element is filled with coagulant (typically an adhesive), and the substrate used as a form is peeled off after the adhesive is coagulated to hold the layer including the element by the coagulated adhesive (bonding member) alone. The bonding member adheres strongly to the layer including the element.

According to a structure of the present invention disclosed in this specification, there is provided a semiconductor device characterized in that a bonding member serves as a supporter and an element is formed on an insulating film that is in contact with the bonding member.

In the above-mentioned structure, the element is a thin film transistor, a light emitting element having an OLED, an element with liquid crystal, a memory element, a thin film diode, a photoelectric conversion element of silicon PIN junction, or a silicon resistor element.

The thickness of the bonding member can be set appropriately. If the bonding member is thinner than the plastic film, the semiconductor device can be thinner, more light-weight, and more flexible. When the bonding member alone holds the layer including the element, the total thickness can be 0.5 mm or less, preferably 0.1 mm to 0.3 mm or less, for example.

The material of the bonding member can be chosen appropriately. For example, a thermally-curable material, a photosensitive material, or a light-transmissive material can be used for the bonding member. When light from a light emitting element of a light emitting display device is to pass through the bonding member, the amount of light that passes can be large and therefore the luminance can be raised. A bonding member that can serve as a barrier by blocking permeation of moisture and oxygen from the outside is desirable for a light emitting device having an OLED since the device is weak against moisture and oxygen.

It is preferable to choose a bonding member that is highly transmissive of light for a transmissive liquid crystal display device if light from the backlight is to pass through the bonding member. The amount of light that passes can be increased by making the bonding member thinner than the plastic film.

Compared to the case where plastic films bonded by a bonding member are used, the present invention can raise the usability of light to improve the luminance and increase the amount of light that passes. This is because the present invention allows light to be diffracted only at the interface between the air and the bonding member by using a supporter that consists solely of the bonding member instead of causing light diffraction at the interface between the air and the plastic film and the interface between the plastic film and the bonding member both due to difference in refractive index (although it also depends on material).

In the above structure, a protective film may be formed in contact with the bonding member.

In the above structure, the semiconductor device is characterized in that the bonding member is pasted on a flat face or curved face base member, and a thin and light-weight semiconductor device can be obtained. Examples of this semiconductor device include video cameras, digital cameras, goggle type displays, indicators for automobiles and machines (such as a car navigation system and a speed meter), personal computers, and portable information terminals. To paste the bonding member and the base member together, the same material as the bonding member may be used or a different adhesive may be used. The bonding member may be pasted on the base member by pasting the bonding member on a plastic film and then pasting the plastic film on the base member.

A process of obtaining the above structure is also one of aspects of the present invention. The process is characterized by having: forming on a first substrate a layer to be peeled that includes a semiconductor element; bonding a second substrate to the layer to be peeled using a first bonding member; peeling the first substrate off; bonding a third substrate to the peeled layer using a second bonding member to sandwich the peeled layer between the second substrate and the third substrate; peeling the second substrate off by removing the first bonding member with a solvent or by lowering the adhesion of the first bonding member with light (ultraviolet light, laser light, or the like); and peeling the third substrate off. Namely, an aspect of the present invention disclosed in this specification relates to a method of manufacturing a semiconductor device, including, a first step of forming on a first substrate a layer to be peeled that includes a semiconductor element, a second step of bonding a second substrate to the layer to be peeled using a first bonding member to sandwich the layer to be peeled between the first substrate and the second substrate, a third step of separating the first substrate from the layer to be peeled, a fourth step of bonding a third substrate to the peeled layer using a second bonding member to sandwich the peeled layer between the second substrate and the third substrate, a fifth step of separating the second substrate from the peeled layer and separating the third substrate from the second bonding member to form the peeled layer that uses the second bonding member as a supporter.

In the above fifth step, the second substrate and the third substrate are both separated from the peeled layer in the same step. Apparently, the second substrate and the third substrate may be separated in different steps and which of them is separated first is not fixed.

The first bonding member is made of a material that can be removed or reduced in adhesion by a solvent or light. The second bonding member may have a different composition than the first bonding member.

The present invention is characterized in that the second bonding member adheres to the peeled layer at a stronger adhesion than its adhesion to the third substrate in order to peel the third substrate off. Therefore, in order to lower the adhesion of the second bonding member to the third substrate, a glass substrate, a quartz substrate, or a metal substrate is used for the first substrate and the second substrate whereas a plastic substrate is used for the third substrate. Alternatively, the third substrate may be a plastic film with an $AlN_XO_Y$ film formed on its surface in order to lower the adhesion of the second bonding member to the third substrate. The second bonding member is solidified while it is in contact with the third substrate. Therefore one side of the second bonding member is flat and the other side of the second bonding member is closely fit to the peeled layer.

The second bonding member thus serves as a supporter ultimately. Therefore the total thickness as well as the total weight of the device in the present invention can be smaller than in the case where a plastic substrate is used as a supporter.

The peeled layer refers to a layer including a semiconductor element. The peeled layer is a layer including one or more elements selected from the group consisting of a thin film transistor, a light emitting element having an OLED, an element with liquid crystal, a memory element, a thin film diode, a photoelectric conversion element of silicon PIN junction, and a silicon resistor element.

When light is to pass through the second bonding member, a material highly transmissive of light is preferred for the second bonding member. For example, if light emitted from an OLED or light from backlight is to pass through the second bonding member, the light transmittance can be improved by adjusting the thickness of the second bonding member.

It is also possible to give flexibility to the entire device by adjusting the thickness of the second bonding member. Therefore the second bonding member can be bonded to various kinds of base members. The base member may have a flat face or a curved face, or may be bendable, or may be film-like. The material of the base member may have any composition such as plastic, glass, a metal, or ceramics. If the bonding member is pasted on a curved face base member, a curved face display is obtained and used as indicators on dashboard, show windows, and the like.

Although the second bonding member alone is used as a supporter in the above manufacture process, the first bonding member alone may serve as a supporter. In this case, materials of the first bonding member and second bonding member are chosen as needed, for example, a material insoluble in a solvent is used for the first bonding member whereas a material soluble in this solvent is used for the second bonding member. After the bonding members are bonded, they are immersed in the solvent to peel the second substrate and the third substrate off leaving the first bonding member to serve as a supporter by itself. When the supporter is the first bonding member alone, the bonding member is in contact with the uppermost layer of the peeled layer. Although the second bonding member alone is used as a supporter in the above manufacture process, the first bonding member or the second bonding member alone may serve as a supporter. In this case, materials of the first bonding member and second bonding member are appropriately selected. Another structure of the present invention disclosed in this specification relates to a method of manufacturing a semiconductor device, comprising: a first step of forming on a first substrate a layer to be peeled that includes a semiconductor element; a second step of bonding a second substrate to the layer to be peeled using a first bonding member to sandwich the layer to be peeled between the first substrate and the second substrate; a third step of separating the first substrate from the layer to be peeled; a fourth step of bonding a third substrate to the peeled layer using a second bonding member to sandwich the peeled layer between the second substrate and the third substrate; and a fifth step of separating the third substrate from the peeled layer and separating the second substrate from the peeled layer to form the peeled layer that uses the first bonding member and the second bonding member as a supporter.

In the above fifth step, the second substrate and the third substrate are both separated from the peeled layer in the same step. The second substrate and the third substrate may be separated in different steps and which of them is separated first is not fixed.

In the above process of the present invention, the first bonding member and the second bonding member may be made of the same material or different materials as long as the materials can be removed by a solvent or light. Desirably, the adhesion of the first bonding member to the peeled layer is stronger than its adhesion to the second substrate and the adhesion of the second bonding member to the peeled layer is stronger than its adhesion to the third substrate.

For example, if the second bonding member is made of a photosensitive adhesive, the third substrate can be separated from the second bonding member by irradiating the second bonding member with light in the fifth step. If the first bonding member is made of a photosensitive adhesive, the second substrate can be separated from the first bonding member by irradiating the first bonding member with light in the fifth step. Accordingly, both the second substrate and third substrate can be separated from the peeled layer in the same step if the same photosensitive adhesive is used for the first bonding member and the second bonding member.

When using a photosensitive adhesive, the first substrate is preferably a light-transmissive substrate, for example, a glass substrate or a quartz substrate.

If a photosensitive adhesive is not chosen, the second substrate or the third substrate can be separated from the peeled layer by lowering the adhesion of the bonding member to the substrate by using a plastic film with an $AlN_xO_y$ film formed on its surface as the second substrate or the third substrate.

Through the above process of the present invention, a peeled layer sandwiched between the first bonding member and the second bonding member is obtained.

When a plastic film is used as the second substrate and an element formed on the first substrate is being transferred to the plastic film, in other words, when the layer including the element is bonded to the film using a bonding member and the film is lifted, the film could be bent and the layer including the element may be cracked because of the bend. The possibility of crack is lowered by transferring an element onto a plastic film in the following procedure: an element formed on the substrate is pasted on a second substrate that is highly rigid using a bonding member before the substrate is peeled off. Following a plastic film (third substrate) is pasted on the layer including the element using a bonding member, the second substrate is separated from the layer including the element.

The other aspect of the present invention disclosed in this specification relates to a method of manufacturing a semiconductor device, comprising: a first step of forming on a first substrate a layer to be peeled that includes a semiconductor element; a second step of bonding a second substrate to the layer to be peeled using a first bonding member to sandwich the layer to be peeled between the first substrate and the second substrate; a third step of separating the first substrate from the layer to be peeled; a fourth step of bonding a third substrate to the peeled layer using a second bonding member to sandwich the peeled layer between the second substrate and the third substrate; and a fifth step of separating the second substrate from the peeled layer to form the peeled layer that uses the second bonding member and the third substrate as a supporter.

In the above structure, the manufacture method is characterized in that the material of the first substrate and second substrate has a rigidity higher than the rigidity of the third substrate. In this specification, rigidity refers to the ability of an object to withstand breakage by bend or twist.

In the above structure, the fifth step is a step of dissolving the first bonding member in a solvent to remove the first bonding member and separate the second substrate from the peeled layer, or a step of separating the second substrate from the peeled layer by irradiating the first bonding member made of a photosensitive adhesive with light.

By keeping the plastic film (the third substrate) bonded without peeling it off as this, a semiconductor device with a supporter composed of the third substrate and the second bonding member is obtained.

Another structure of the present invention disclosed in this specification is a semiconductor device characterized in that a plastic substrate and a bonding member make a supporter and an element is formed on an insulating film that is in contact with the bonding member.

In the above structure, the element is a thin film transistor, a light emitting element having an OLED, an element with liquid crystal, a memory element, a thin film diode, a photo-electric conversion element of silicon PIN junction, or a silicon resistor element.

In the above structure, the semiconductor device is characterized in that the plastic substrate is pasted on a flat face or curved face base member, and a thin and light-weight semiconductor device can be obtained. Examples of this semiconductor device include video cameras, digital cameras, goggle type displays, indicators for automobiles and machines (such as a car navigation system and a speed meter), personal computers, and portable information terminals.

In the above processes, the third step is for separating the first substrate from the layer to be peeled by a peeling method in which two layers are peeled by applying a mechanical force and utilizing the film stress between the two layers. How the first substrate is separated is not particularly limited, and a method of separating the substrate from the peeled layer by providing a separation layer between the peeled layer and the first substrate and removing the separation layer with a chemical (etchant), or a method of separating the first substrate from the peeled layer by forming a separation layer from amorphous silicon (or polysilicon) between the peeled layer and the first substrate and irradiating the separation layer with laser light through the first substrate to release hydrogen contained in amorphous silicon and create a gap, or other methods can be employed. If the first substrate is peeled off using laser light, it is desirable to set the heat treatment temperature to 410° C. or lower to form the element included in the peeled layer, so that hydrogen is not released before peeling.

The peeling method that utilizes film stress between two layers is the most desirable because it does not damage the peeled layer and it can peel throughout the entire surface without fail irrespective of whether the peeled layer has a small area or a large area. Specifically, a first material layer that is a metal layer or a nitride layer is formed on a first substrate, a second material layer that is an oxide layer is formed by sputtering, an element is formed on the second material layer, and a mechanical force is applied to separate the first material layer and the second material layer from each other at the interface. The laminate of the first material layer and second material layer is free from peeling or other process disturbance but can be easily and cleanly separated at a point in the second material layer or at the interface by a physical measure, typically application of a mechanical force, for example, by pulling at it by hands.

In other words, the bond between the first material layer and the second material layer is strong enough to withstand thermal energy but weak against dynamic energy to cause peeling since there is stress distortion between the first material layer having tensile stress and the second material layer having compressive stress immediately before the layers are peeled off. The present inventors have found that the peeling phenomenon is deeply related with the film internal stress and call a peeling process that utilizes the film internal stress as a stress peel off process.

When the above peeling method using the first material layer and the second material layer is employed in the semiconductor device characterized by using the plastic substrate and the bonding member as a supporter and forming an element on an insulating film that is in contact with the bonding member, the insulating film that is in contact with the bonding member serves as the second material layer. The insulating film is preferably an oxide film which is formed by sputtering and serves as an oxide layer which contains a noble gas element. The noble gas element is one or more kinds of elements selected from the group consisting of He, Ne, Ar, Kr, and Xe. With a noble gas element contained, the second material layer can make the semiconductor device flexible.

Furthermore, the term plastic substrate as used herein is not particularly limited as long as it is a plastic substrate having plasticity; for example, it refers to a substrate consisting of polyethylene terephthalate (PET), polyethersulfone (PES), polyethylene naphthalate (PEN), polycarbonate (PC), nylon, polyetheretherketone (PEEK), polysulfone (PSF), polyetherimide (PEI), polyarylate (PAR), polybutylene terephthalate (PBT), or polyimide.

An experiment has been conducted to examine the adhesion for each of a silicon nitride film, an AlN film, and an AlNO film when formed between a plastic substrate (PC film) and a bonding member. The silicon nitride film is separated from the plastic substrate while it keeps adhered to the bonding member. On the other hand, the AlN film and the AlNO film are separated only from the bonding member while they keep adhered to the plastic substrate.

As shown in FIGS. 16A to 16G, another aspect of the present invention relates to a method of manufacturing a semiconductor device, comprising: a first step of forming on a first substrate 10 a layer to be peeled 13 that includes a semiconductor element; a second step of bonding a second substrate 15 to the layer to be peeled 13 using a first bonding member 14 to sandwich the layer to be peeled between the first substrate and the second substrate; a third step of separating the first substrate 10 from the layer to be peeled 13; a fourth step of bonding a third substrate 17 in which a protective film 18 is formed to the peeled layer using a second bonding member 16 to sandwich the peeled layer between the second substrate and the third substrate; and a fifth step of separating the second substrate from the peeled layer and separating the third substrate from the second bonding member to form the peeled layer that uses the second bonding member 16 and the protective film 18 as a supporter.

In the above structure, the manufacture method is characterized in that the protective film is a silicon nitride film or a silicon oxynitride film. By forming the protective film, moisture and impurities from the outside can be effectively blocked to avoid contamination.

DETAILED DESCRIPTION OF THE PREFERRED EMBODIMENTS

Embodiment Modes of the present invention will be described below.

Embodiment Mode 1

The following is a brief description on a typical peeling procedure and semiconductor device manufacturing method using the present invention. The description will be given with reference to FIGS. 1A to 1G.

Figure 1A:
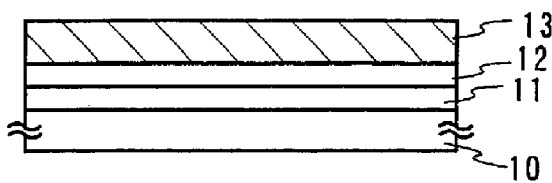
FIGS. 1A to 1G are process diagrams showing Embodiment Mode 1.

In FIG. 1A, reference numeral 10 denotes a first substrate, 11, a first material layer that is a nitride layer or a metal layer, 12, a second material layer that is an oxide layer, and 13, a layer to be peeled.

The first substrate 10 in FIG. 1A can be a glass substrate, a quartz substrate, a ceramic substrate, or the like. A semiconductor substrate, typically a silicon substrate, or a metal substrate, typically a stainless steel substrate, may also be used.

First, the first material layer 11 is formed on the substrate 10 as shown in FIG. 1A. The first material layer 11 may have compressive stress or tensile stress immediately after it is formed. However, it is important to use for the first material layer 11 a material which is free from peeling or other disturbances caused by heat treatment, or laser light irradiation, for forming the layer to be peeled and which gives a tensile stress of 1 to $1 \times 10^{10}$ dyne/cm$^2$ after the layer to be peeled is formed. A typical example thereof is a single layer of an element selected from the group consisting of W, WN, TiN, and TiW, or of an alloy material or compound material mainly containing the above elements, or a laminate of the above elements. The first material layer 11 is formed by sputtering.

Next, the second material layer 12 is formed on the first material layer 11. It is important to use for the second material layer 12 a material which is free from peeling or other disturbances caused by heat treatment, or laser light irradiation, for forming the layer to be peeled and which gives a tensile stress of 1 to $1 \times 10^{10}$ dyne/cm$^2$ after the layer to be peeled is formed. A typical example of the second material layer 12 is a single layer or a laminate of silicon oxide, silicon oxynitride, and a metal oxide. The second material layer 12 may be formed by sputtering. When forming the second material layer 12 by sputtering, noble gas, typically argon gas, is introduced into the chamber so that a minute amount of noble gas element is contained in the second material layer 12.

The first material layer 11 and the second material layer 12 are each set to have an appropriate thickness in a range between 1 mm and 100 nm to adjust the internal stress of the first material layer 11 and the internal stress of the second material layer 12.

FIGS. 1A to 1G show an example in which the first material layer 11 is formed in contact with the substrate 10 in order to simplify the process. However, an insulating layer or metal layer that serves as a buffer layer may be formed between the substrate 10 and the first material layer 11 to improve the adhesion of 11 to the substrate 10.

Next, the layer to be peeled 13 is formed on the second material layer 12 (FIG. 1A). The layer to be peeled 13 is a layer that includes various elements (a thin film transistor, a light emitting element having an OLED, an element with liquid crystal, a memory element, a thin film diode, a photoelectric conversion element of silicon PIN junction, a silicon resistor element). When the element is one with liquid crystal, the layer to be peeled 13 includes an opposite substrate. The layer to be peeled 13 can be formed by heat treatment at a temperature the first substrate 10 can withstand. In the present invention, a film is not peeled off by the heat treatment for forming the layer to be peeled 13 even though the internal stress of the second material layer 12 is different from the internal stress of the first material layer 11.

The next processing is for partially lowering the adhesion between the first material layer 11 and the second material layer 12. The processing for partially lowering the adhesion is laser irradiation in which the second material layer or the first material layer is partially irradiated with light along the perimeter of the region to be peeled off, or local pressurizing externally applied along the perimeter of the region to be peeled off to damage a part on the inside of the second material layer or a part of the interface. Specifically, a diamond pen or the like is used to depress a hard needle vertically and apply load while the layers are moved. Preferably, scriber apparatus is used and the depression amount is set to 0.1 to 2 mm to apply a pressure while moving the layers. To provide a portion that facilitates the peeling phenomenon, namely an initiator, in this way prior to peeling is important. Owing to the preprocessing for selectively (partially) lowering the adhesion, peeling failure is avoided and the yield is improved.

Figure 1B:
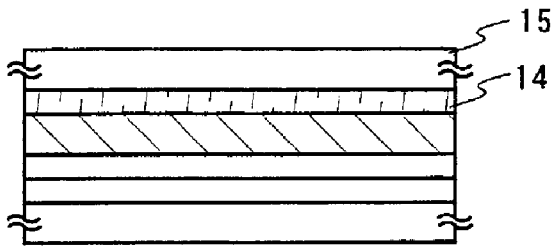

Next, a second substrate 15 is bonded to the layer to be peeled 13 using a first bonding member 14 (FIG. 1B). Reaction-cured adhesives, thermally-curable adhesives, photo-curable adhesives such as UV-curable adhesives, anaerobic adhesives, and other various kinds of curable adhesives can be used for the first bonding member 14. These adhesives may be soluble in solvents or may be photosensitive and be reduced in adhesion when irradiated with light. These adhesives can have any composition and may be, for example, epoxy-based, acrylate-based, or silicone-based. The adhesives are formed into a bonding member by application, for example. The first bonding member is removed in a later step. Here, an adhesive material soluble in a solvent is chosen for the first bonding member.

The second substrate 15 can be a glass substrate, a quartz substrate, a ceramic substrate, a plastic substrate or the like. A semiconductor substrate, typically a silicon substrate, or a metal substrate, typically a stainless steel substrate, may also be used. Incidentally, in the case where a photosensitive bonding member is used for the first bonding member or the second bonding member, as one of the first substrate and the second substrate, there is preferably used a substrate having light transmittance.

Figure 1C:
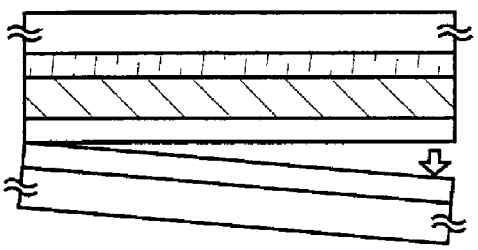

Next, the first substrate 10 on which the first material layer 11 is formed is pulled off by a physical measure in the direction indicated by the arrow in FIG. 1C starting from the side of the region where the adhesion is partially lowered (FIG. 1C). Since the second material layer 12 has compressive stress and the first material layer 11 has tensile stress, the first substrate can be pulled off with a relatively small force (for example, by hands, pressure of gas sprayed through a nozzle, supersonic, or the like).

Figure 1D:
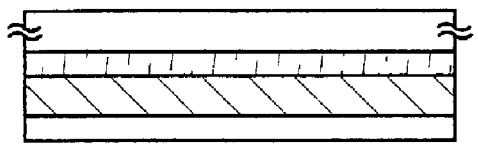

In this way the layer to be peeled 13 formed on the second material layer 12 can be separated from the first substrate 10. The state after peeling is shown in FIG. 1D.

Figure 1E:
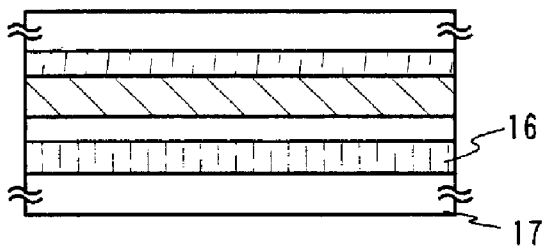

Subsequently, a third substrate 17 is bonded to the second material layer 12 (and the peeled layer 13) using a second bonding member 16 formed of a different material than the material of the first bonding member 14 (FIG. 1E). It is important that the adhesion of the second bonding member 16 to the second material layer 12 (and the peeled layer 13) is stronger than its adhesion to the third substrate 17.

Reaction-cured adhesives, thermally-curable adhesives, photo-curable adhesives such as UV-curable adhesives, anaerobic adhesives, and other various kinds of curable adhesives can be used for the second bonding member 16. These adhesives may be soluble in solvents or may be photosensitive and reduced in adhesion when irradiated with light. These adhesives can have any composition and may be epoxy-based, acrylate-based, or silicone-based. The adhesives are formed into a bonding member by application, for example. The second bonding member becomes a supporter of peeled layer in a later step. Here, UV-curable adhesives are used for the second bonding member 16.

The third substrate 17 can be a glass substrate, a quartz substrate, a ceramic substrate, a plastic substrate, or the like. A semiconductor substrate, typically a silicon substrate, or a metal substrate, typically a stainless steel substrate, may also be used. Here, in order to lower the adhesion of the second bonding member to the third substrate, a plastic film with an $AlN_XO_Y$ film formed on its surface is used as the third substrate 17.

The $AlN_XO_Y$ film on the plastic film is formed by sputtering using, for example, an aluminum nitride (AlN) target in an atmosphere obtained by mixing argon gas, nitrogen gas, and oxygen gas. It is sufficient if the $AlN_XO_Y$ film contains a few or more atm % of nitrogen, preferably, 2.5 to 47.5 atm %. The nitrogen concentration can be adjusted by adjusting sputtering conditions (the substrate temperature, the type and flow rate of material gas, the film formation pressure, and the like) as needed.

Figure 1F:
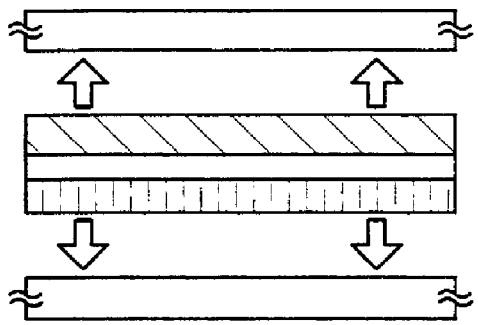
Figure 1G:
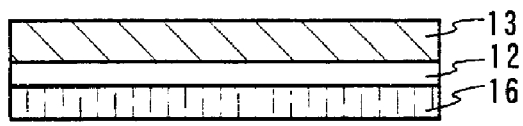

Next, the layers are immersed in a solvent to separate the second substrate 15 and the third substrate 17 (FIG. 1F). The first bonding member is easily removed since it is made of an adhesive material soluble in a solvent, thereby separating the second substrate 15 from the peeled layer 13. On the other hand, the solvent permeates the interface between the third substrate 17 and the second bonding member 16 and weakens the adhesion at the interface, to thereby separate the third substrate 17 from the second material layer 12. Although the second substrate 15 and the third substrate 17 are separated in the same step in the example shown here, there is no particular limitation. The substrates may be separated in different steps and which of them is separated first is not fixed.

The element included in the peeled layer 13 is formed such that its input/output terminal is exposed in the uppermost layer of the peeled layer (namely, the layer closest to the second substrate side). Accordingly, it is desirable to remove the first bonding member on the peeled layer surface completely after the step of separating the second substrate, so that the input/output terminal portion is exposed.

Through the above steps, a semiconductor device having the peeled layer 13 with the second bonding member 16 serving as a supporter is manufactured. (FIG. 1g) The thus obtained semiconductor device is thin, light-weight, and flexible since the supporter consists solely of the second bonding member 16.

In the example shown here, the semiconductor device is completed through the above steps. The above steps may be used to finish the semiconductor device halfway. For instance, element forming steps may be added to the above steps so that a peeled layer including a circuit that is composed of TFTs is formed following the above steps and then the thus obtained peeled layer that uses a second bonding member as a supporter can be used in the element forming steps to complete various kinds of semiconductor devices, typically a light emitting device having an OLED or a liquid crystal display device.

For example, an active matrix light emitting device can be manufactured by arranging pixel electrodes to form a matrix pattern, forming a second bonding member that has TFTs connected to the pixel electrodes through the above steps, and then forming OLEDs that use the pixel electrodes as cathodes or anodes. The thus obtained light emitting device is thin and light-weight since the supporter consists solely of the second bonding member.

It is also possible to manufacture a passive light emitting device having an OLED.

Also, an active matrix liquid crystal display device can be manufactured by arranging pixel electrodes to form a matrix pattern and forming a second bonding member that has TFTs connected to the pixel electrodes through the above steps, followed by an opposite substrate pasting step and a liquid crystal injection step. Specifically, a seal member or the like is used to paste an opposite substrate to a bonding member provided with TFTs that are connected to pixel electrodes while keeping a certain distance between the opposite substrate and the bonding member with a gap holding member such as a spacer. Then a liquid crystal material is held between the opposite substrate and the pixel electrodes to complete the liquid crystal display device. The thus obtained liquid crystal display device is thin and light-weight since the supporter is composed of the second bonding member and the opposite substrate alone.

Embodiment Mode 2

Embodiment Mode 1 shows an example in which the second bonding member alone serves as a supporter. In this embodiment mode, an example of using the first bonding member and the second bonding member as a supporter is shown. FIG. 2A to FIG. 2E are roughly identical with FIGS. 1A to 1E. Therefore, detailed descriptions will be omitted here and only differences between Embodiment Mode 1 and Embodiment Mode 2 will be described.

In FIGS. 2A to 2G, reference numeral 20 denotes a first substrate, 21, a first material layer that is a nitride layer or a metal layer, 22, a second material layer that is an oxide layer, 23, a layer to be peeled, 24, a first bonding member, 25, a second substrate, 26, a second bonding member, and 27, a third substrate.

Figure 2A:
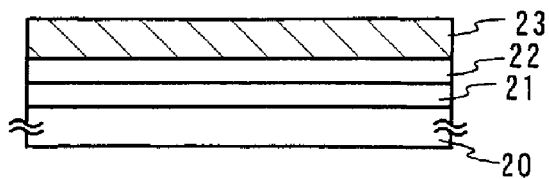
FIGS. 2A to 2G are process diagrams showing Embodiment Mode 2.
Figure 2B:
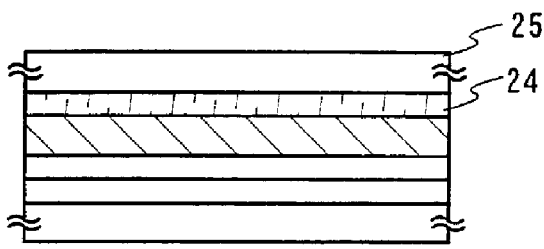
Figure 2C:
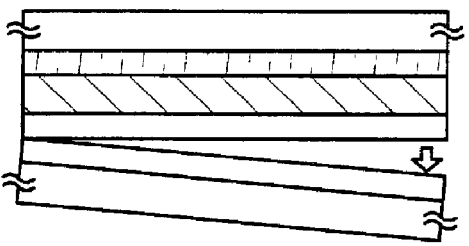
Figure 2D:
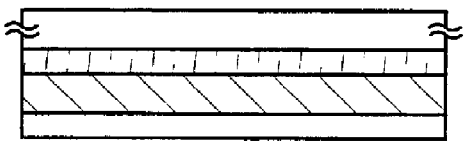
Figure 2E:
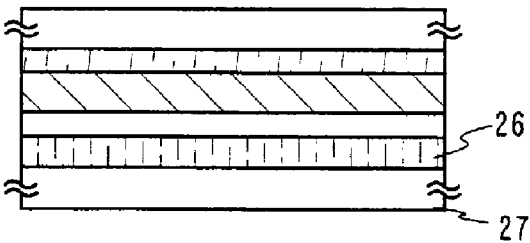

First, according to Embodiment Mode 1, there is obtained a state of FIG. 2E in the same procedure.

Here, reaction-cured adhesives, thermally-curable adhesives, photo-curable adhesives such as UV-curable adhesives, anaerobic adhesives, and other various kinds of curable adhesives can be used for the first bonding member 24. These adhesives may be soluble in solvents or may be photosensitive and reduced in adhesion when irradiated with light. These adhesives can have any composition and may be epoxy-based, acrylate-based, or silicone-based. The adhesives are formed into a bonding member by application, for example. The first bonding member becomes a supporter in a later step. Here, thermally-curable adhesives which are reduced in adhesion when irradiated with ultraviolet rays are used for the first bonding member. It is important that the adhesion of the first bonding member 24 to the peeled layer 23 is stronger than its adhesion to the second substrate 25.

In order to lower the adhesion of the first bonding member to the second substrate, a plastic film with an $AlN_xO_y$ film formed on its surface may be used as the second substrate.

The material of the second bonding member 26 may be the same as the material of the first bonding member 24. Here, a thermally-curable adhesive the adhesion of which is lowered when irradiated with ultraviolet rays is used for the second bonding member. The second bonding member too serves as a supporter of the peeled layer in a later step. It is important that the adhesion of the second bonding member 26 to the second material layer 22 (and the peeled layer 23) is stronger than its adhesion to the third substrate 27.

In order to lower the adhesion of the second bonding member to the third substrate, a plastic film with an $AlN_xO_y$ film formed on its surface may be used as the third substrate.

Figure 2F:
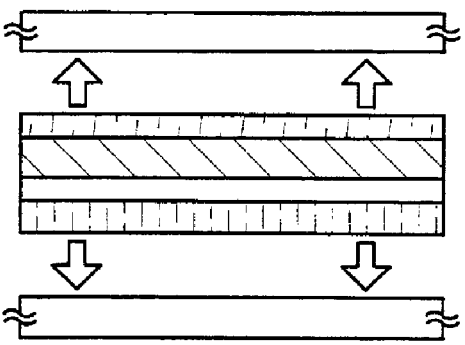

The state of FIG. 2E is obtained by following the procedure of Embodiment Mode 1. Then the bonding members are irradiated with ultraviolet rays to lower the adhesion of the first bonding member 24 to the second substrate 25 and the adhesion of the second bonding member 26 to the third substrate 27, thereby separating the second substrate and the third substrate (FIG. 2F). Although the second substrate 25 and the third substrate 27 are separated in the same step in the example shown here, there is no particular limitation. The substrates may be separated in different steps and which of them is separated first is not fixed. Also, this embodiment mode may be combined with Embodiment Mode 1.

Although a thermally-curable adhesive that is lowered in adhesion by ultraviolet irradiation is used in the example shown here, other adhesive materials may be used. For example, a UV-curable adhesive may be used for the first bonding member and the second bonding member. In this case, a plastic film with an $AlN_xO_y$ film formed on its surface is used as the second substrate and bonded by the first bonding member made of a UV-curable adhesive, a plastic film with an $AlN_xO_y$ film formed on its surface is used as the third substrate and bonded by the second bonding member made of a UV-curable adhesive. Then, the layers are immersed in a solvent and the solvent permeates the interface between the third substrate and the second bonding member to weaken the adhesion at the interface, thereby separating the third substrate from the second material layer. Similarly, the second substrate is separated from the first bonding member.

The element included in the peeled layer 23 is formed such that its input/output terminal is exposed in the uppermost layer of the peeled layer (namely, the layer closest to the second substrate side). Accordingly, it is desirable to selectively remove the first bonding member that covers the input/output terminal portion after the step of separating the second substrate, so that the input/output terminal portion is exposed.

Figure 2G:
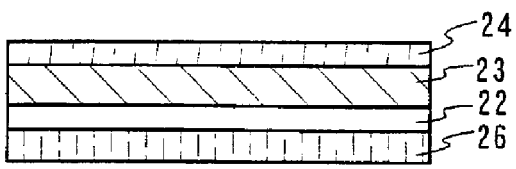

Through the above steps show in FIG. 2G, a semiconductor device having the peeled layer 23 with the first bonding member 24 and the second bonding member 26 serving as a supporter is manufactured. Note that the peeled layer 23 is sandwiched between the first bonding member 24 and the second bonding member 26. The thus obtained semiconductor device is thin, light-weight, and flexible since the supporter consists solely of the first bonding member 24 and the second bonding member 26.

In the example shown here, the semiconductor device is completed through the above steps. The above steps may be used to finish the semiconductor device halfway. For instance, element forming steps may be added to the above steps so that a peeled layer including a circuit that is composed of TFTs is formed following the above steps and then the thus obtained peeled layer that uses a first bonding member and a second bonding member as a supporters can be used in the element forming steps to complete various kinds of semiconductor devices, typically a light emitting device having an OLED or a liquid crystal display device.

This embodiment mode may be combined freely with Embodiment Mode 1.

Embodiment Mode 3

Embodiment Mode 1 shows an example in which the second bonding member alone serves as a supporter. In this embodiment mode, art example of using the second bonding member and the third substrate as a supporter is shown. FIGS. 3A to 3E are roughly identical with FIGS. 1A to 1E. Therefore detailed descriptions will be omitted here and only differences between Embodiment Mode 1 and Embodiment Mode 2 will be described.

In FIGS. 3A to 3G, reference numeral 30 denotes a first substrate, 31, a first material layer that is a nitride layer or a metal layer, 32, a second material layer that is an oxide layer, 33, a layer to be peeled, 34, a first bonding member, 35, a second substrate, 36, a second bonding member, and 37, a third substrate.

Figure 3A:
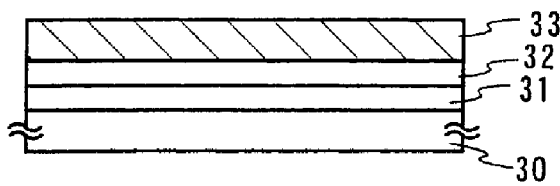
FIGS. 3A to 3G are process diagrams showing Embodiment Mode 3.
Figure 3B:
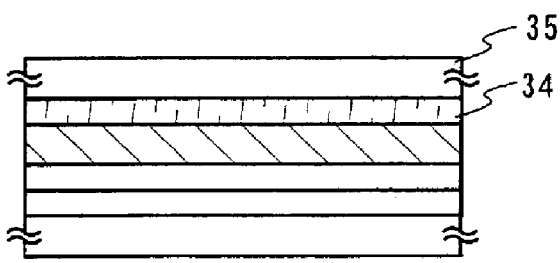
Figure 3C:
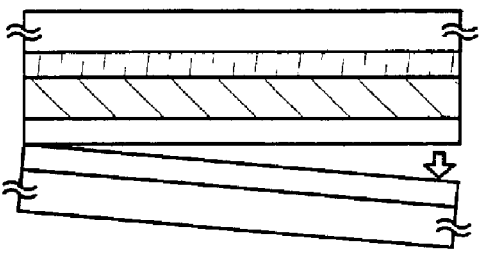
Figure 3D:
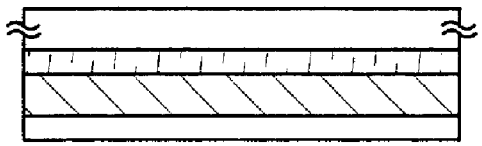
Figure 3E:
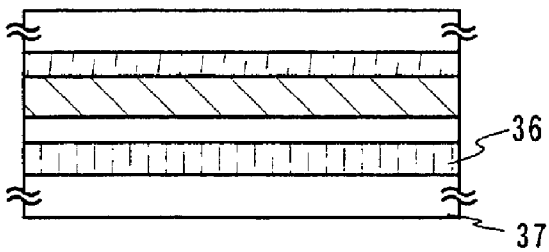

First, according to Embodiment Mode 1, there is obtained a state of FIG. 3E in the same procedure.

The first substrate 30 can be a glass substrate, a quartz substrate, a ceramic substrate, or the like. A semiconductor substrate, typically a silicon substrate, or a metal substrate, typically a stainless steel substrate, may also be used. Here, there is used a glass substrate (#1737) having a thickness of 0.7 mm.

Here, a quartz substrate (1.1 mm in thickness) thicker and higher in rigidity than the first substrate 30 is used as the second substrate 35. If a plastic film is used as the second substrate, when an element formed on the first substrate 30 is being transferred to the plastic film, in other words, when the peeled layer 33 is bonded to the film using the first bonding member 34 and the film is lifted, there was a fear that the film could be bent and the peeled layer 33 may be cracked because of the bend. Therefore, the possibility of crack is lowered by the following procedure: the peeled layer 33 formed on the first substrate 30 is pasted on the second substrate 35 that is highly rigid using the first bonding member 34, the first substrate 30 is peeled off, a plastic film (third substrate 37) is pasted on the layer including the element using the second bonding member 36, and then separating the second substrate 35.

The third substrate 37 here is a plastic film.

Here, an adhesive material soluble in a solvent is chosen for the first bonding member 34.

The material used here for the second bonding member 36 is high in adhesion both to the third substrate and to the peeled layer.

Figure 3F:
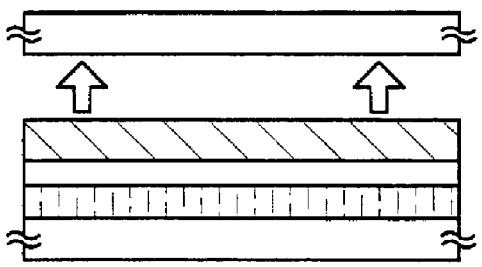

The state of FIG. 3E is obtained following the procedure of Embodiment Mode 1. Then, the layers are immersed in a solvent to separate the second substrate 35 alone (FIG. 3F). Formed from an adhesive material soluble in a solvent, the first bonding member is easily removed to separate the second substrate 35 from the peeled layer 33.

The element included in the peeled layer 33 is formed such that its input/output terminal is exposed in the uppermost layer of the peeled layer (namely, the layer closest to the second substrate side). Accordingly, it is desirable to remove the first bonding member on the peeled layer surface completely after the step of separating the second substrate, so that the input/output terminal portion is exposed.

In the example shown here, the first bonding member 34 is made of an adhesive soluble in a solvent and is immersed in a solvent to separate the second substrate. However, there is no particular limitation and, for example, the second substrate maybe separated by irradiating with ultraviolet rays the first bonding member that is made of the thermally-curable adhesive (whose adhesion is lowered by ultraviolet irradiation) shown in Embodiment Mode 2.

Figure 3G:
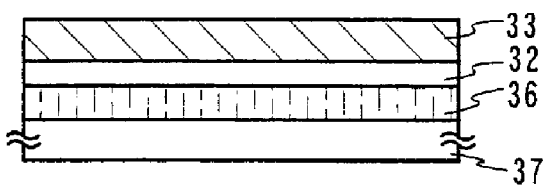

Through the above steps, a semiconductor device having the peeled layer 33 with the second bonding member 36 and the third substrate 37 serving as a supporter is manufactured as shown in FIG. 3G. The oxide layer 32 that is the second material layer is interposed between the second bonding member 36 and the peeled layer 33. The thus obtained semiconductor device is flexible throughout since the second material layer 32 is formed by sputtering and a minute amount of noble gas element is contained in the second material layer 32.

In the example shown here, the semiconductor device is completed through the above steps. The above steps may be used to finish the semiconductor device halfway. For instance, element forming steps may be added to the above steps so that a peeled layer including a circuit that is composed of TFTs is formed following the above steps and then the thus obtained peeled layer that uses a second bonding member and third substrate as a supporter can be used in the element forming steps to complete various kinds of semiconductor devices, typically a light emitting device having an OLED or a liquid crystal display device.

This embodiment mode may be combined freely with Embodiment Mode 1 or Embodiment Mode 2.

More detailed descriptions will be given on the present invention structured as above through the following embodiments.

Embodiment 1

Figure 4:
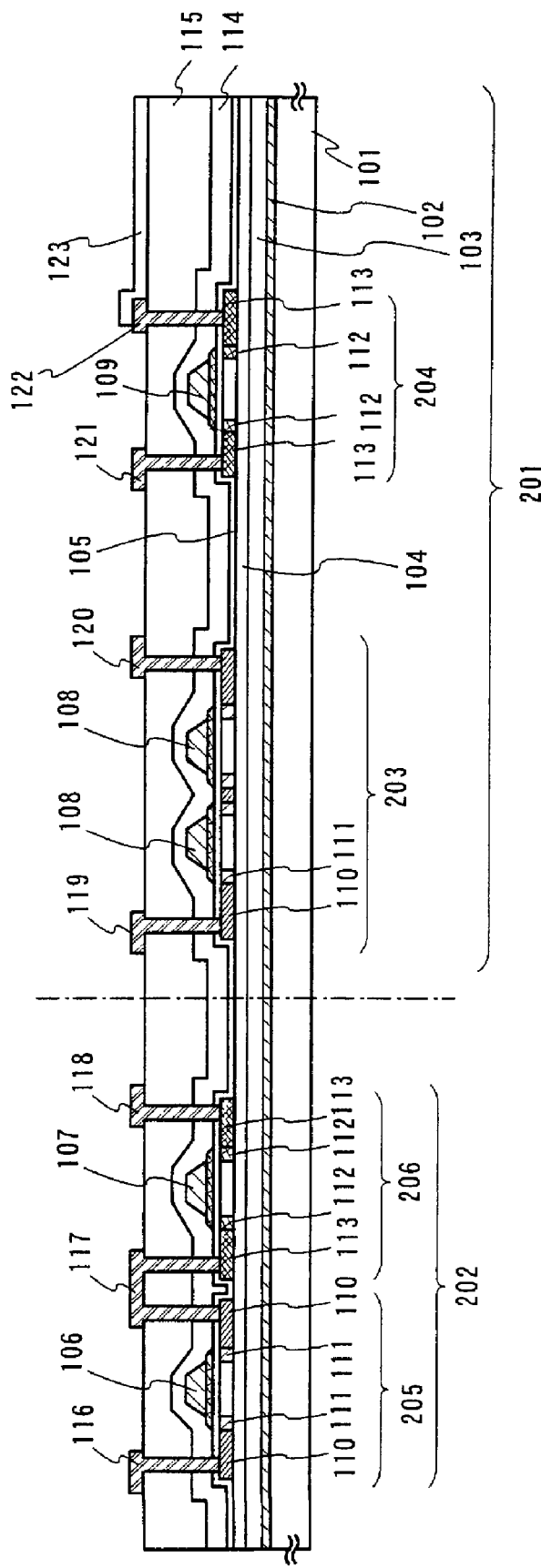
FIG. 4 is a sectional view of a first substrate having elements.

Here, a detailed description will be given on a method of manufacturing a light emitting device having an OLED in which a pixel portion (n-channel TFTs and p-channel TFTs) and TFTs (n-channel TFTs and p-channel TFTs) of a driving circuit that are provided in the periphery of the pixel portion are formed on the same substrate at the same time (FIG. 4).

First, a silicon oxynitride film (not shown) is formed by plasma CVD to have a thickness of 100 nm on a heat-resistant glass substrate (first substrate 101) with a thickness of 0.7 mm. The silicon oxynitride film is for protecting the substrate from later dry etching and for preventing contamination of an etching chamber, and is not particularly necessary.

Although a glass substrate is used as the first substrate 101 in this embodiment, there is no particular limitation and it may be a quartz substrate, a semiconductor substrate, a ceramic substrate, or a metal substrate.

Next, a tungsten film is formed as a first material layer 102 on the silicon oxynitride film by sputtering to have a thickness of 50 nm. The tungsten film formed by sputtering is fluctuated in thickness about the perimeter of the substrate. Accordingly, the tungsten film is patterned by forming a resist for dry etching of the perimeter of the substrate alone. Although patterning is conducted here, it is not particularly necessary.

The first material layer 102 is not limited to the tungsten film and other materials, tungsten nitride or titanium nitride, for example, may be used. The thickness of the first material layer 102 can be set as needed within a range of 10 to 200 nm.

On the tungsten film, a silicon oxide film is formed as a second material layer 103 by sputtering to have a thickness of 200 nm. A silicon oxide film formed by sputtering is used here but other materials, an oxide, for example, may be used instead. The thickness of the second material layer 103 can be set as needed within a range of 50 to 400 nm. The first material layer 102 (tungsten film) and the second material layer 103 (silicon oxide film) are formed on the first substrate as this, an element is formed on the second material layer in a later step, and then a mechanical force is applied to separate the first material layer and the second material layer from each other at the interface. It is preferable to create a flow of noble gas such as argon by sputtering during forming the second material layer 103 so that a minute amount of noble gas element is contained in the second material layer 103.

Next, a silicon oxynitride film is formed as a lower layer of a base insulating film on the silicon oxide film by plasma CVD at a temperature of 400° C. using $SiH_4$, $NH_3$, and $N_2O$ as material gas (the composition ratio of the silicon oxynitride film: Si=32%, O=27%, N=24%, H=17%). The silicon oxynitride film has a thickness of 50 nm (preferably 10 to 200 nm). The surface of the film is washed with ozone water and then an oxide film on the surface is removed by diluted fluoric acid (diluted down to 1/100). Next, a silicon oxynitride film is formed as an upper layer of the base insulating film by plasma CVD at a temperature of 400° C. using $SiH_4$ and $N_2O$ as material gas (the composition ratio of the silicon oxynitride film: Si=32%, O=59%, N=7%, H=2%). The silicon oxynitride film has a thickness of 100 nm (preferably 50 to 200 nm) and is laid on the lower layer to form a laminate. Without exposing the laminate to the air, a semiconductor film having an amorphous structure (here, an amorphous silicon film) is formed on the laminate by plasma CVD at a temperature of 300° C. using $SiH_4$ as material gas. The semiconductor film is 54 nm (preferably 25 to 80 nm) in thickness.

A base insulating film 104 in this embodiment has a two-layer structure. However, the base insulating film may be a single layer or more than two layers of insulating films mainly containing silicon. The material of the semiconductor film is not limited but it is preferable to form the semiconductor film from silicon or a silicon germanium alloy ($Si_xGe_{1-x}$ (X=0.0001 to 0.02)) by a known method (sputtering, LPCVD, plasma CVD, or the like). Plasma CVD apparatus used may be one that processes wafer by wafer or one that processes in batch. The base insulating film and the semiconductor film may be formed in succession in the same chamber to avoid contact with the air.

The surface of the semiconductor film having an amorphous structure is washed and then a very thin oxide film, about 2 nm in thickness, is formed on the surface using ozone water. Next, the semiconductor film is doped with a minute amount of impurity element (boron or phosphorus) in order to control the threshold of the TFTs. Here, the amorphous silicon film is doped with boron by ion doping in which diborane ($B_2H_6$) is excited by plasma without mass separation. The doping conditions include setting the acceleration voltage to 15 kV, the flow rate of gas obtained by diluting diborane to 1% with hydrogen to 30 sccm, and the dose to $2 \times 10^{12}/cm^2$.

Next, a nickel acetate solution containing 10 ppm of nickel by weight is applied by a spinner. Instead of application, nickel may be sprayed onto the entire surface by sputtering.

The semiconductor film is subjected to heat treatment to crystallize it and obtain a semiconductor film having a crystal structure. The heat treatment is achieved in an electric furnace or by irradiation of intense light. When heat treatment in an electric furnace is employed, the temperature is set to 500 to 650° C. and the treatment lasts for 4 to 24 hours. Here, a silicon film having a crystal structure is obtained by heat treatment for crystallization (at 550° C. for 4 hours) after heat treatment for dehydrogenation (at 500° C. for an hour). Although the semiconductor film is crystallized here by heat treatment using an electric furnace, it may be crystallized by a lamp annealing apparatus capable of achieving crystallization in a short time. This embodiment employs a crystallization technique in which nickel is used as a metal element for accelerating crystallization of silicon. However, other known crystallization techniques, solid phase growth and laser crystallization, for example, may be employed.

An oxide film on the surface of the silicon film having a crystal structure is removed by diluted fluoric acid or the like. Then in order to enhance the crystallization rate and repair defects remaining in crystal grains, the silicon film is irradiated with laser light (XeCl, the wavelength: 308 nm) in the air or in an oxygen atmosphere. The laser light may be excimer laser light having a wavelength of 400 nm or less, or the second harmonic or third harmonic of a YAG laser. Pulse laser light having a repetition frequency of 10 to 1000 Hz is employed. The laser light is collected by an optical system to have an energy density of 100 to 500 $mJ/cm^2$ and scans the silicon film surface at an overlapping ratio of 90 to 95%. Here, the film is irradiated with laser light at a repetition frequency of 30 Hz and an energy density of 470 $mJ/cm^2$ in the air. Since the laser light irradiation is conducted in the air or in an oxygen atmosphere, an oxide film is formed on the surface as a result. A pulse laser is used in the example shown here but a continuous wave laser may be employed instead. It is preferable to employ a continuous wave solid-state laser and the second to fourth harmonic of the fundamental wave in order to obtain crystals of large grain size when crystallizing an amorphous semiconductor film. Typically, the second harmonic (532 nm) or third harmonic (355 nm) of a Nd:$YVO_4$ laser (fundamental wave: 1064 nm) is employed. When using a continuous wave laser, laser light emitted from a 10 W power continuous wave $YVO_4$ laser is converted into harmonic by a non-linear optical element. Alternatively, the harmonic is obtained by putting a $YVO_4$ crystal and a non-linear optical element in a resonator. The harmonic is preferably shaped into oblong or elliptical laser light on an irradiation surface by an optical system and then irradiates an irradiation object. The energy density required at this point is about 0.01 to 100 $MW/cm^2$ (preferably 0.1 to 10 $MW/cm^2$). During the irradiation, the semiconductor film is moved relative to the laser light at a rate of 10 to 2000 cm/s.

The oxide film formed by laser light irradiation is removed by diluted fluoric acid and then the surface is treated with ozone water for 120 seconds to form as a barrier layer an oxide film having a thickness of 1 to 5 nm in total. The barrier layer here is formed using ozone water but it may be formed by oxidizing the surface of the semiconductor film having a crystal structure through ultraviolet irradiation in an oxygen atmosphere, or formed by oxidizing the surface of the semiconductor film having a crystal structure through oxygen plasma treatment, or by using plasma CVD, sputtering or evaporation to form an about 1 to 10 nm thick oxide film. In this specification, a barrier layer refers to a layer which has a quality and thickness that allows a metal element to pass in a gettering step and which serves as an etching stopper in a step of removing the layer serving as a gettering site.

Next, an amorphous silicon film containing argon is formed on the barrier layer by sputtering to serve as a gettering site. The thickness of the amorphous silicon film is 50 to 400 nm, here 150 nm. The conditions for forming the amorphous silicon film here include setting the film formation pressure to 0.3 Pa, the gas (Ar) flow rate to 50 sccm, the film formation power to 3 kW, and the substrate temperature to 150° C. The atomic concentration of argon contained in the amorphous silicon film formed under the above conditions is $3\times10^{20}$ to $6\times10^{20}/cm^3$ and the atomic concentration of oxygen thereof is $1\times10^{19}$ to $3\times10^{19}/cm^3$. Thereafter, heat treatment is conducted in an electric furnace at 550° C. for 4 hours for gettering to reduce the nickel concentration in the semiconductor film having a crystal structure. Lamp annealing apparatus may be used instead of an electric furnace.

Using the barrier layer as an etching stopper, the gettering site, namely, the amorphous silicon film containing argon, is selectively removed. Then, the barrier layer is selectively removed by diluted fluoric acid. Nickel tends to move toward a region having high oxygen concentration during gettering, and therefore it is desirable to remove the barrier layer that is an oxide film after gettering.

Next, a thin oxide film is formed on the surface of the obtained silicon film containing a crystal structure (also called a polysilicon film) using ozone water. A resist mask is then formed and the silicon film is etched to form island-like semiconductor layers separated from one another and having desired shapes. After the semiconductor layers are formed the resist mask is removed.

The oxide film is removed by an etchant containing fluoric acid, and at the same time, the surface of the silicon film is washed. Then, an insulating film mainly containing silicon is formed to serve as a gate insulating film 105. The gate insulating film here is a silicon oxynitride film (composition ratio: Si=32%, O=59%, N=7%, H=2%) formed by plasma CVD to have a thickness of 115 nm.

Next, a laminate of a first conductive film with a thickness of 20 to 100 nm and a second conductive film with a thickness of 100 to 400 nm is formed on the gate insulating film. In this embodiment, a tantalum nitride film with a thickness of 50 nm is formed on the gate insulating film 105 and then a tungsten film with a thickness of 370 nm is laid thereon. The conductive films are patterned by the procedure shown below to form gate electrodes and wires.

The conductive materials of the first conductive film and second conductive film are elements selected from the group consisting of Ta, W, Ti, Mo, Al, and Cu, or alloys or compounds mainly containing the above elements. The first conductive film and the second conductive film may be semiconductor films, typically polycrystalline silicon films, doped with phosphorus or other impurity elements or may be Ag—Pd—Cu alloy films. The present invention is not limited to a two-layer structure conductive film. For example, a three-layer structure consisting of a 50 nm thick tungsten film, 500 nm thick aluminum-silicon alloy (Al—Si) film, and 30 nm thick titanium nitride film layered in this order may be employed. When the three-layer structure is employed, tungsten of the first conductive film may be replaced by tungsten nitride, the aluminum-silicon alloy (Al—Si) film of the second conductive film may be replaced by an aluminum-titanium alloy (Al—Ti) film, and the titanium nitride film of the third conductive film may be replaced by a titanium film. Alternatively, a single-layer conductive film may be used.

ICP (inductively coupled plasma) etching is preferred for etching of the first conductive film and second conductive film (first etching treatment and second etching treatment). By using ICP etching and adjusting etching conditions (the amount of electric power applied to a coiled electrode, the amount of electric power applied to a substrate side electrode, the temperature of the substrate side electrode, and the like), the films can be etched and tapered as desired. The first etching treatment is conducted after a resist mask is formed. The first etching conditions include applying an RF (13.56 MHz) power of 700 W to a coiled electrode at a pressure of 1 Pa, employing $CF_4$, $Cl_2$, and $O_2$ as etching gas, and setting the gas flow rate ratio thereof to 25:25:10 (sccm). The substrate side (sample stage) also receives an RF power of 150 W (13.56 MHz) to apply a substantially negative self-bias voltage. The area (size) of the substrate side electrode is 12.5 cm×12.5 cm and the coiled electrode is a disc 25 cm in diameter (here, a quartz disc on which the coil is provided). The W film is etched under these first etching conditions to taper it around the edges. Thereafter, the first etching conditions are switched to the second etching conditions without removing the resist mask. The second etching conditions include using $CF_4$ and $Cl_2$ as etching gas, setting the gas flow rate ratio thereof to 30:30 (sccm), and giving an RF (13.56 MHz) power of 500 W to a coiled electrode at a pressure of 1 Pa to generate plasma for etching for about 30 seconds. The substrate side (sample stage) also receives an RF power of 20 W (13.56 MHz) to apply a substantially negative self-bias voltage. Under the second etching conditions where a mixture of $CF_4$ and $Cl_2$ is used, the W film and the TaN film are etched to almost the same degree. The first etching conditions and the second etching conditions constitute the first etching treatment.

Next, the first doping treatment is conducted without removing the resist mask. The first doping treatment employs ion doping or ion implantation. Typically, phosphorus (P) or arsenic (As) is used as an impurity element that imparts the n type conductivity. Here, ion doping is used, the flow rate of gas obtained by diluting phosphine ($PH_3$) with hydrogen to 5% is set to 40 sccm, the dose is set to $2\times10^{15}$ atoms/cm$^2$, and the acceleration voltage is set to 80 keV. In this case, the first conductive layer serves as a mask against the impurity element that imparts the n type conductivity and a first impurity region is formed in a self-aligning manner. The first impurity region is doped with the impurity element that imparts the n type conductivity in a concentration of $1\times10^{20}$ to $1\times10^{21}/cm^3$. Here, a region having the same concentration range as the first impurity region is called an n$^+$ region.

Next follows the second etching treatment with the resist mask kept in place. The third etching conditions include using $CF_4$ and $Cl_2$ as etching gas, setting the gas flow rate ratio thereof to 30:30 (sccm), and giving an RF (13.56 MHz) power of 500 W to a coiled electrode at a pressure of 1 Pa to generate plasma for etching for 60 seconds. The substrate side (sample stage) also receives an RF power of 20 W (13.56 MHz) to apply a substantially negative self-bias voltage. Then, the third etching conditions are switched to the fourth etching conditions without removing the resist mask. The fourth etching conditions include using $CF_4$, $Cl_2$, and $O_2$ as etching gas, setting the gas flow rate ratio thereof to 20:20:20 (sccm), and giving an RF (13.56 MHz) power of 500 W to a coiled electrode at a pressure of 1 Pa to generate plasma for etching for about 20 seconds. The substrate side (sample stage) also receives an RF power of 20 W (13.56 MHz) to apply a substantially negative self-bias voltage. The third etching conditions and the fourth etching conditions constitute the second etching treatment. At this stage, gate electrodes 106 to 109 and wires having the first conductive layer as the lower layer and the second conductive layer as the upper layer are formed.

Next, the resist mask is removed for the second doping treatment. The second doping treatment employs ion doping or ion implantation. Here, ion doping is used, the flow rate of gas obtained by diluting phosphine ($PH_3$) with hydrogen to 5% is set to 30 sccm, the dose is set to $1.5 \times 10^{14}$ atoms/cm$^2$, and the acceleration voltage is set to 90 keV. In this case, the first conductive layer and the second conductive layer serve as masks against the impurity element that imparts the n type conductivity and a second impurity region is formed in a self-aligning manner. The second impurity region is doped with the impurity element that imparts the n type conductivity in a concentration of $1 \times 10^{16}$ to $1 \times 10^{17}$/cm$^3$. Here, a region having the same concentration range as the second impurity region is called an n$^-$ region.

In this embodiment, the first etching treatment comes first and then the first doping treatment, the second etching treatment and the second doping treatment follow in this order. However, apparently, the order of the treatment is not limited thereto. For example, the first etching treatment may be followed by the second etching treatment, the second doping treatment, and the first doping treatment in the order stated, or the first etching treatment may be followed by the second etching treatment, the first doping treatment, and the second doping treatment in the order stated.

Next, a resist mask is formed for the third doping treatment. The resist mask covers the semiconductor layers that form n-channel TFTs. Through the third doping treatment, third impurity regions doped with an impurity element that imparts the p type conductivity are formed in the semiconductor layers for forming p-channel TFTs and the semiconductor layers for forming a capacitor storage in the pixel portion and driving circuit. The concentration of the impurity element that imparts the p type conductivity in the third impurity regions is $1 \times 10^{18}$ to $1 \times 10^{20}$/cm$^3$. The third impurity regions are already doped with phosphorus (P) in the previous step but are doped with the impurity element that imparts the p type conductivity in a concentration large enough to obtain the p type conductivity. Here, a region having the same concentration range as the third impurity regions is also called a p$^-$ region.

Without removing the above-described resist mask, the fourth doping treatment is conducted. Through the fourth doping treatment, fourth impurity regions doped with an impurity element that imparts the p type conductivity are formed in the semiconductor layers for forming p-channel TFTs and the semiconductor layers for forming a storage capacitor in the pixel portion and driving circuit. The concentration of the impurity element that imparts the p type conductivity in the fourth impurity regions is $1 \times 10^{20}$ to $1 \times 10^{21}$/cm$^3$. The fourth impurity regions are already doped with phosphorus (P) in the previous step but are doped with the impurity element that imparts the p type conductivity in a concentration 1.5 to 3 times the phosphorus concentration to obtain the p type conductivity. Here, a region having the same concentration range as the fourth impurity regions is also called a p$^+$ region.

Through the above steps, an impurity region having the n type or p type conductivity is formed in each semiconductor layer. In the pixel portion and driving circuit, p$^-$ regions 112 and p$^+$ regions 113 are formed in a semiconductor layer that forms a p-channel TFT whereas n$^-$ regions 111 and n$^+$ regions 110 are formed in a semiconductor layer that forms an n-channel TFT.

The next step is activation treatment of the impurity elements used to dope the semiconductor layers. The activation step employs rapid thermal annealing (RTA) using a lamp light source, irradiation of a YAG laser or excimer laser from the back side, or heat treatment using a furnace, or a combination of these methods. Here, an electric furnace is used and heat treatment is conducted in a nitrogen atmosphere at 550° C. for 4 hours for the activation treatment.

Next, a first interlayer insulating film 114 is formed to cover almost the entire surface. The first interlayer insulating film in this embodiment is a silicon oxide film formed by plasma CVD to have a thickness of 50 nm. The first interlayer insulating film is not limited to a silicon oxide film and a single layer or laminate of other insulating films containing silicon may be used.

In the example shown in this embodiment, the first interlayer insulating film is formed after the above-described activation. However, the insulating film may be formed before the activation.

On the first interlayer insulating film, a silicon nitride film containing hydrogen is formed as a second interlayer insulating film (not shown) to have a thickness of 100 nm. Then, the semiconductor layers are subjected to heat treatment (at 300 to 550° C. for 1 to 12 hours) to hydrogenate the semiconductor layers. This step is for terminating dangling bonds in the semiconductor layers using hydrogen contained in the second interlayer insulating film. The semiconductor layers are hydrogenated irrespective of the presence of the first interlayer insulating film that is a silicon oxide film. Other hydrogenation methods employable include plasma hydrogenation (using hydrogen excited by plasma).

Next, a third interlayer insulating film 115 is formed on the second interlayer insulating film from an organic insulating material. In this embodiment, an acrylic resin film is formed to have a thickness of 1.05 μm. Formed next are contact holes reaching the conductive layers that serve as the gate electrodes or gate wires and contact holes reaching the impurity regions. In this embodiment, etching treatment is conducted several times in succession. Also, in this embodiment, the second interlayer insulating film is used as an etching stopper to etch the third interlayer insulating film, then the first interlayer insulating film is used as an etching stopper to etch the second interlayer insulating film, and then the first interlayer insulating film is etched.

Thereafter, electrodes 116 to 122, specifically, a source wire, a power supply line, a lead-out electrode, a connection electrode, etc. are formed from Al, Ti, Mo, or W. Here, the electrodes and wires are obtained by patterning a laminate of a Ti film (100 nm in thickness), an Al film containing silicon (350 nm in thickness), and another Ti film (50 nm in thickness). The source electrode, source wire, connection electrode, lead-out electrode, power supply line, and the like are thus formed as needed. A lead-out electrode for the contact with a gate wire covered with an interlayer insulating film is provided at an end of the gate wire, and other wires also have at their ends input/output terminal portions having a plurality of electrodes for connecting to external circuits and external power supplies.

A driving circuit 202 having a CMOS circuit in which an n-channel TFT 205 and a p-channel TFT 206 are combined complementarily and a pixel portion 201 with a plurality of pixels each having an n-channel TFT 203 or a p-channel TFT 204 are formed in the manner described above.

In the driving circuit, the semiconductor layer of the n-channel TFT (a first n-channel TFT) 205 has: a channel formation region, the second impurity regions (n$^-$ regions) 111 partially overlapping the conductive layer that forms the gate electrode with an insulating film sandwiched between the region and the layer; and the first impurity regions (n$^+$ regions) 110 one of which functions as a source region and the other of which functions as a drain region.

In the driving circuit, the semiconductor layer of the p-channel TFT (a first p-channel TFT) 206 has: a channel formation region, the third impurity regions (p$^-$ regions) 112 partially overlapping the conductive layer that forms the gate electrode with an insulating film sandwiched between the region and the layer; and the fourth impurity regions (p+ regions) 113 one of which functions as a source region and the other of which functions as a drain region.

Combinations of these TFTs (the first n-channel TFT and the first p-channel TFT) are appropriately used to form a shift register circuit, a buffer circuit, a level shifter circuit, a latch circuit, and the like to constitute the driving circuit.

In the pixel portion 201, namely, the whole region where a large number of pixels are arranged to form a matrix, each pixel has a plurality of n-channel TFTs or p-channel TFTs. These TFTs can be roughly divided into TFTs that are electrically connected to OLEDs formed in a later step and other TFTs. The TFTs electrically connected to OLEDs formed in a later step (also called current controlling TFTs) control a current flowing into the OLEDs and may either be n-channel TFTs or p-channel TFTs. A TFT electrically connected to an OLED formed in a later step in this embodiment, is a p-channel TFT (a second p-channel TFT) 204. In this embodiment, each pixel has one TFT other than the second p-channel TFT and has an n-channel TFT (a second n-channel TFT) 203 as a switching TFT. A drain region of the second n-channel TFT is connected to a gate electrode of the second p-channel TFT through a connection electrode. A connection electrode 122 electrically connected to an anode or cathode of an OLED to be formed later is formed in a drain region of the second p-channel TFT.

The electrodes are patterned and then the resist is removed for heat treatment at 150° C. for 12 minutes. Next, a pixel electrode 123 is formed such that it is in contact with and overlaps the connection electrode that is in contact with the drain region of the second p-channel TFT. In this embodiment, the pixel electrode functions as an anode of an OLED and light emitted from the OLED passes through the pixel electrode. Therefore, a transparent conductive film is used for the pixel electrode. A conductive film having a large work function, typically a conductive oxide film is used for the anode. The conductive oxide film is formed from indium oxide, tin oxide, or zinc oxide, or a compound of those. The pixel electrode in this embodiment is obtained by forming an ITO (an alloy of indium oxide and tin oxide) that is a transparent conductive film by sputtering to have a thickness of 110 nm and patterning it in the pixel portion to form a matrix pattern and have a desired shape. Examples of other transparent conductive films that can be employed include an indium oxide-zinc oxide alloy ($In_2O_3$—ZnO) film and a zinc oxide (ZnO) film. At the same time the pixel electrode is formed, electrode pads may be formed from the transparent conductive film and patterned so that they are in contact with and overlap the electrodes of the input/output terminal portions.

After finishing patterning the pixel electrode, the resist is removed for heat treatment at 250° C. for an hour.

Figure 9:
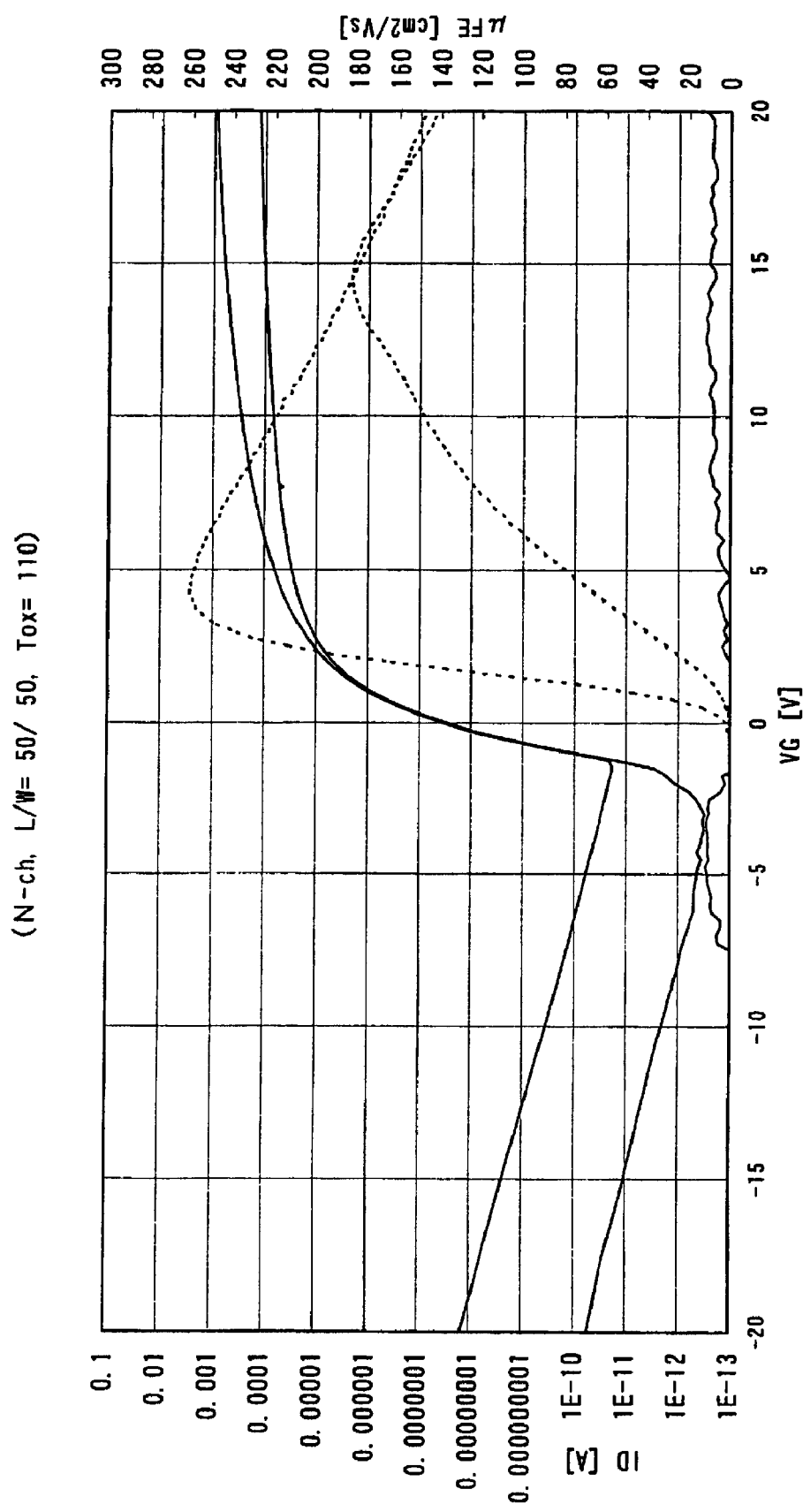
FIG. 9 is a graph showing the V-I characteristic of an n-channel TFT before peeling.
Figure 10:
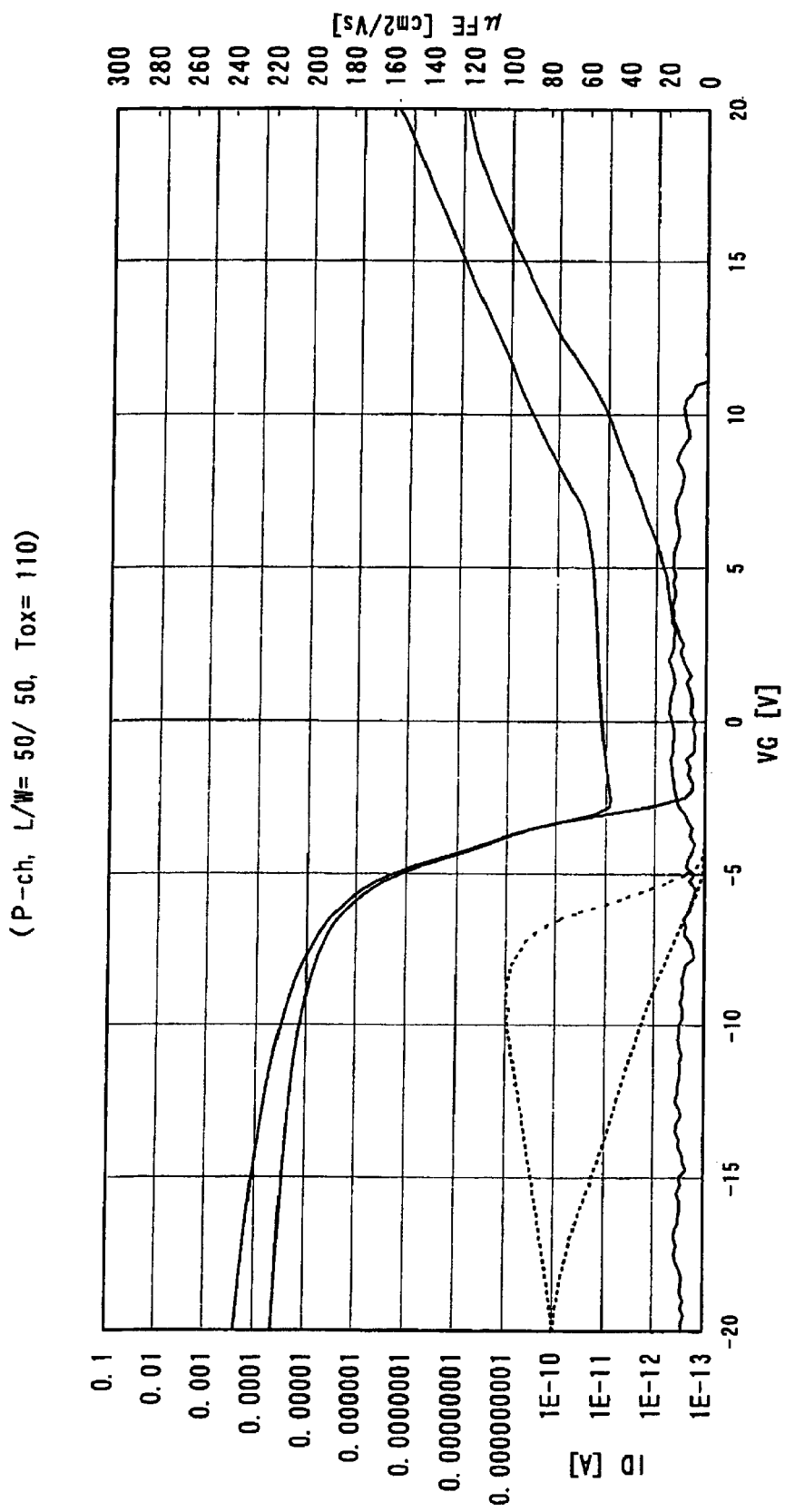
FIG. 10 is a graph showing the V-I characteristic of a p-channel TFT before peeling.

FIG. 4 shows the device that has finished the manufacture process up through the steps described above. Electric measurement on the TFTs formed on the first substrate 101 is conducted at this point. The V-I characteristic graph of the n-channel TFT with the ratio of the channel width W to the channel length L set to 50 μm:50 μm is shown in FIG. 9. FIG. 10 shows the V-I characteristic graph of the p-channel TFT with the ratio of the channel width W to the channel length L set to 50 μm:50 μm.

Next, an insulator called a bank is formed on each end of the pixel electrode 123 so as to cover each end of 123. The bank is formed from an insulating film containing silicon or a resin film. In this embodiment, a photo-sensitive acrylic resin film is 0 formed to have a thickness of 1 μm and is patterned into a desired shape. Then, heat treatment is conducted at 250° C. for an hour.

A highly rigid substrate (a second substrate), here a quartz substrate with a thickness of 1.1 mm, is next prepared and is bonded to the side on which the TFTs are formed using an adhesive soluble in a solvent (a first bonding member) or a photosensitive adhesive (a first bonding member) that is reduced in adhesion when irradiated with light (including ultraviolet rays). The TFTs are thus sandwiched between the quartz substrate (the second substrate) and the glass substrate (the first substrate). The use of a highly rigid substrate prevents cracking in the layer including the TFTs during a later peeling step. In this embodiment, an adhesive soluble in water is used as the first bonding member. Examples of other usable adhesive include an adhesive soluble in an alcoholic-based organic solvent and a photosensitive adhesive. Before bonding the substrates, it is important to provide an initiator that facilitates the peeling phenomenon during a later peeling step. By selectively (partially) lowering the adhesion as preprocessing, peeling failure is avoided and the yield is improved. The preprocessing consists of, for example, laser light scanning or scratching of the thin film while a needle vertically depresses the thin film to apply a load and the film is moved along the perimeter of the region to be peeled. In this embodiment, a scriber apparatus is used and the depression amount is set to 0.1 to 2 mm to scratch the thin film at a pressure of 0.5 kg/cm².

Desirably, the peeling is started from an area near the region subjected to the preprocessing.

Next, the first substrate on which the first material layer (tungsten film) is formed is pulled off by a physical measure. Thus, the layer including the TFTs is transferred onto the second substrate and the surface exposed is the second material layer (silicon oxide film formed by sputtering). The adhesion between the first material layer and the second material layer is strong enough to withstand the heat treatment temperature but is very weak against a mechanical force. Therefore, the first substrate can be pulled off with a relatively small force (for example, by hands, pressure of a gas sprayed through a nozzle, supersonic, or the like). Since the adhesion is weakened in part by the above-described preprocessing, it requires an even smaller force to pull the first substrate off.

If giving the first substrate and the second substrate the same size makes works difficult, the second substrate can be slightly smaller in size than the first substrate. If a plurality of pixel portions are formed on one sheet of the first substrate, the first substrate may be cut into pieces so that each piece has one pixel portion.

Next, a third substrate is bonded to the exposed second material layer using the second bonding member to sandwich the TFTs between the quartz substrate (the second substrate) and the third substrate. Any substrate can be used as the third substrate.

The second bonding member is an adhesive composed of a UV-curable epoxy resin which is not water-soluble. A (0.3 mm thick) polycarbonate (PC) film with an $AlN_xO_Y$ film formed on the surface is used as the third substrate. It is preferable to choose for the second bonding member a material whose adhesion to the second material layer is stronger than at least its adhesion to the $AlN_xO_Y$ film. This way the third substrate can be peeled in a later step so that the second bonding member alone serves as a supporter.

As the device finishes the manufacture process up through the above steps, a micrometer is used to measure the total thickness of the layer sandwiched between the second substrate (1.1 mm) and the third substrate (0.3 mm) (the total thickness including the thickness of the pair of substrates). The measured thickness thereof is 1.6 to 1.9 mm.

The pair of substrates sandwiching the TFTs are completely immersed in a tank filled with water to dissolve the water-soluble bonding member (the first bonding member) and peel the second substrate off. The dissolution speed of the water-soluble bonding member (the first bonding member) may be increased by supersonic or irradiation of laser light. At the same time, immersion in water separates the third substrate from the second bonding member at the interface to peel the third substrate off. Although the second substrate and the third substrate are peeled in the same step, they may be peeled in different steps.

The peeling is followed by heat treatment for vaporizing moisture. Treatment for thoroughly removing the water-soluble bonding member (the first bonding member) may be conducted after the second substrate is peeled off.

Figure 11:
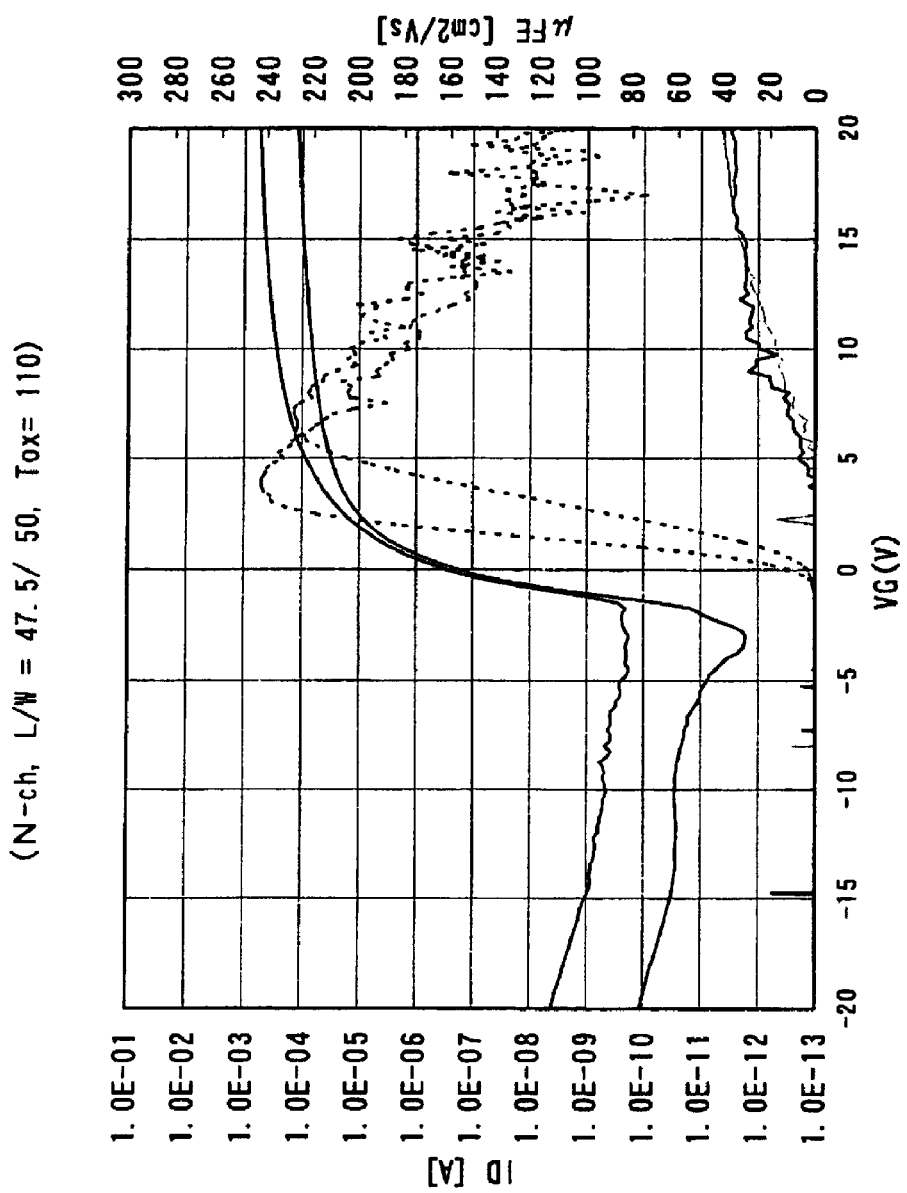
FIG. 11 is a graph showing the V-I characteristic of an n-channel TFT after peeling.
Figure 12:
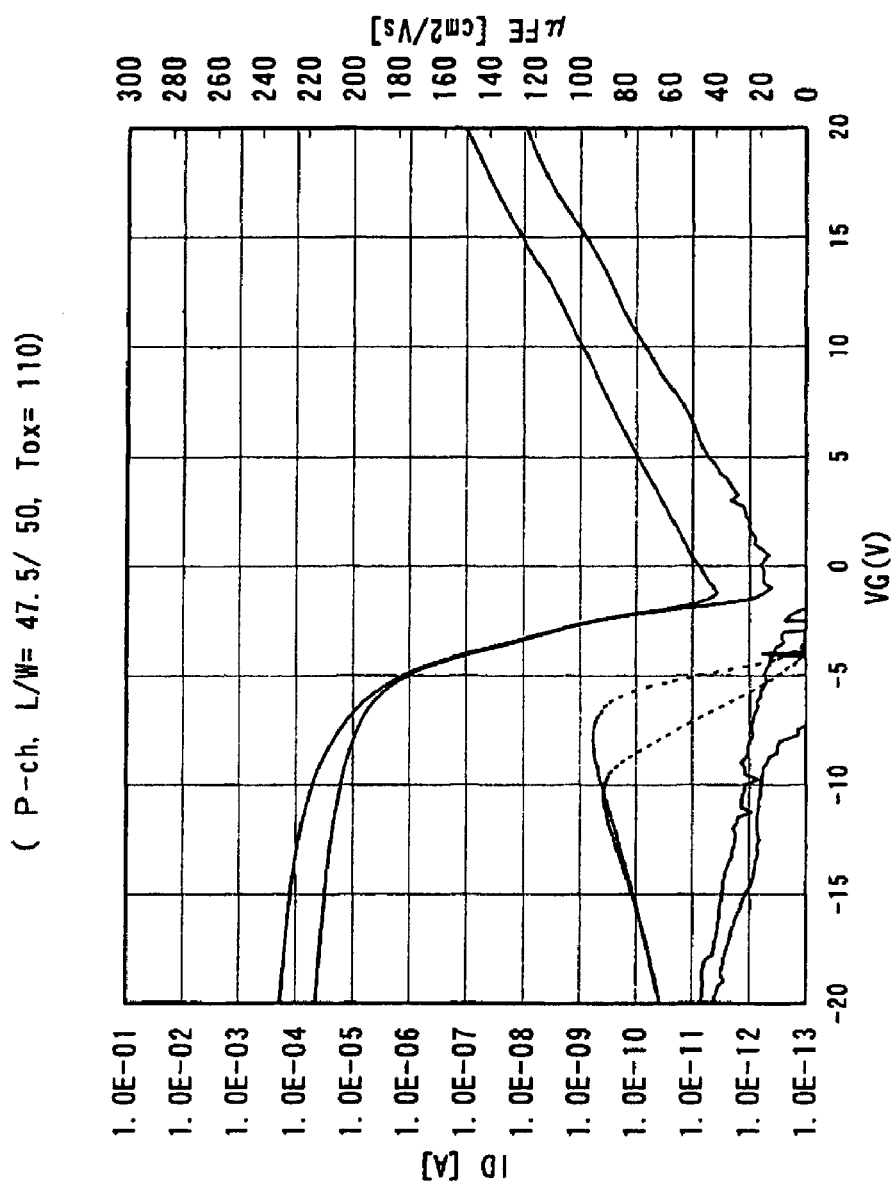
FIG. 12 is a graph showing the V-I characteristic of a p-channel TFT after peeling.

Thus obtained is the layer including the TFTs with the second bonding member alone serving as a supporter. At this stage, the electric measurement of the TFTs is again conducted. The V-I characteristic graph of the n-channel TFT with the ratio of the channel width W to the channel length L set to 50 μm:50 μm is shown in FIG. 11. FIG. 12 shows the V-I characteristic graph of the p-channel TFT with the ratio of the channel width W to the channel length L set to 50 μm:50 μm.

As can be read from FIGS. 9 to 12, there is almost no change in TFT characteristic. Accordingly, it can be said that transferring and pasting done by following these procedures do not affect the TFTs. Although the TFTs may be formed directly on a plastic substrate, the low heat resistance of the substrate makes heat treatment at 300° C. or higher difficult to conduct as well as forming TFTs having as excellent characteristic as the one in FIGS. 9 to 12. By forming TFTs on a heat-resistant substrate and then peeling the heat-resistant substrate off as shown in this embodiment, TFTs having as excellent characteristic as the one in FIG. 9 to 12 can be obtained.

As the device finishes the manufacture process up through the above steps, a micrometer is used to measure the total thickness (including the thickness of the second bonding member) of the layer including the TFTs and using the second bonding member alone as a supporter. The measured thickness thereof is 140 to 230 μm. As proved by this, total thickness can be thinner than a PC film (0.3 mm). Since the TFT characteristic can be measured despite being this thin, it can be said that the second bonding member makes a sufficient supporter by itself and the device can be driven as a semiconductor device.

Next, an EL layer is formed on the pixel electrode whose ends are covered by the banks and a cathode of an OLED is formed thereon.

An EL layer (a layer for light emission and for moving of carriers to cause light emission) has a light emitting layer and a free combination of electric charge transporting layers and electric charge injection layers. For example, a low molecular weight organic EL material or a high molecular weight organic EL material is used to form an EL layer. An EL layer may be a thin film formed of a light emitting material that emits light by singlet excitation (fluorescence) (a singlet compound) or a thin film formed of a light emitting material that emits light by triplet excitation (phosphorescence) (a triplet compound). Inorganic materials such as silicon carbide may be used for the electric charge transporting layers and electric charge injection layers. Known organic EL materials and inorganic materials can be employed.

It is said that the preferred material of a cathode is a metal having a small work function (typically, a metal element belonging to Group 1 or 2 in the periodic table) or an alloy of such metal. The light emission efficiency is improved as the work function becomes smaller. Therefore, an alloy material containing Li (lithium) that is one of alkali metals is particularly desirable as the cathode material. The cathode also functions as a wire common to all pixels and has a terminal electrode in an input terminal portion through a connection wire.

Next, the OLED having at least a cathode, an organic compound layer, and an anode is preferably sealed by an organic resin, a protective film, a sealing substrate, or a sealing can to cut the OLED completely off from the outside and prevent permeation of external substances, such as moisture and oxygen, that accelerate degradation due to oxidization of the EL layer. However, it is not necessary to provide the protective film or the like in the input/output terminal portions to which an FPC needs to be connected later.

The FPC (flexible printed circuit) is attached to the electrodes of the input/output terminal portions using an anisotropic conductive material. The anisotropic conductive material is composed of a resin and conductive particles several tens to several hundreds μm in diameter whose surfaces are plated by Au or the like. The conductive particles electrically connect the electrodes of the input/output terminal portions with wires formed in the FPC.

If necessary, an optical film such as a circularly polarizing plate composed of a polarizing plate and a phase difference plate may be provided and an IC chip may be mounted.

Through the above steps, a module type light emitting device to which an FPC is connected is completed. In the light emitting device of this embodiment, light emitted from an OLED passes through the second bonding member alone to reach the eyes of an observer. Therefore, the second bonding member is desirably formed from a light-transmissive material.

Alternatively, the pixel electrode may serve as a cathode and an EL layer and an anode may be layered on the cathode so that light is emitted in the direction opposite to the light emitting direction in this embodiment. In this case, the anode is formed from a light-transmissive material.

In the example shown in this embodiment, the OLED is formed after the manufacture is advanced to a point where the second bonding member alone serves as a supporter. However, the OLED may be sealed prior to peeling the first substrate off, and then the second substrate may be bonded, the first substrate may be peeled off, the third substrate may be bonded, and the second substrate and the third substrate may be peeled off. In the case where the substrate is peeled off after the OLED is formed, it is preferable to use an organic solvent as the solvent and employ an adhesive soluble in an organic solvent instead of using water as the solvent and employing a water-soluble adhesive.

If the second bonding member is chosen properly when forming the OLED precedes peeling of the substrate, it is possible to peel the second substrate alone while leaving the third substrate in place. In this case, a light emitting device having an OLED can be formed on a plastic substrate.

Embodiment 2

In this embodiment, an example of manufacturing the light emitting device having OLED by the step that differs from Embodiment 1 in part.

According to Embodiment 1, state of complete the first etching process is obtained. Although in Embodiment 1, the first doping process, the second etching process, and the second doping process are performed in this order after the first etching process is performed. However, in this embodiment, the second etching process is performed after the first etching process is performed. And after removing the resist mask, low density doping is performed by new doping process to form the fifth impurity region (n⁻⁻ region). Subsequently, new resist mask is formed, and doping is selectively performed using same dose amount as the second doping process, thereby doping is performed using same dose amount as the first doping process.

TFT formed by steps of this embodiment is described with reference to FIG. 5.

In this embodiment, the fifth impurity region (n⁻⁻ region) is formed by performing low density doping by new doping process. The gate electrodes 305 to 308 are used as masks to perform doping with whole surface. As doping process may be used ion doping or ion injecting. The condition of ion doping process is that dose amount is $1.5 \times 10^{14}$ atoms/cm² and the accelerate voltage is 60 to 100 keV. As impurity elements imparting an n-type may be used phosphor (P), or arsenic (As). The fifth impurity element region is formed in a self-alignment manner. The n-type impurity element is added to the fifth impurity region at $1 \times 10^{16}$ to $1 \times 10^{17}$/cm³. In this embodiment, the same density region as the fifth impurity region is referred to as n⁻⁻ region.

Subsequently, new resist mask is formed. In this case, since OFF current value of the switching TFT 403 is lowered, the mask is formed to cover the channel formation region of the semiconductor layer that forms the switching TFT 403 of the pixel portion 401 or the part. In addition, the mask is formed to protect the channel formation region of the semiconductor layer that forms the p-channel TFT 406 of the driver circuit or the periphery region thereof. Further, the mask is formed to cover the channel formation region of the semiconductor layer that forms the current control TFT 404 of the pixel portion 401 and the periphery region thereof.

The second impurity region 311 that overlaps with a part of the gate electrode 305 by doping selectively by using same dose amount as the second doping process using above-mentioned resist masks.

Without removing the above-mentioned resist masks, doping is selectively performed by using the same dose amount as the first doping process to form the first impurity regions 312 and 315. At the switching TFT 403, the region covered with resist becomes the fifth impurity region 316.

In the above-mentioned steps, doping is performed to the semiconductor layer that is to be an activation layer of the n-channel TFT.

Next, after removing the above-mentioned resist masks, as Embodiment 1, the resist mask is formed, and the third and fourth doping processes are performed continuously.

In the above-mentioned steps, n-type or p-type conductive type impurity region is formed on each semiconductor layer. At the pixel portion 401 and the driver circuit 402, p⁻ regions 314, 318, p⁺ regions 313 and 317 are formed on the semiconductor layer that forms the p-channel type TFT, n⁻ region 311 and n⁺ region 312 are formed on the semiconductor layer that forms n-channel TFT of the driver circuit 402, and n⁺ region 315 and n⁻⁻ region 316 are formed on the semiconductor layer that forms n-channel type TFT of the pixel portion 401, respectively.

According to Embodiment 1, an activation process of the impurity elements added to each semiconductor layer is performed. Next, the formation process of the first interlayer insulating film 309, the formation process of the second interlayer insulating process (not illustrated), the hydrogenation process of the semiconductor layer, and the formation process of the third interlayer insulating film 310 are performed according to Embodiment 1.

The pixel electrode 319 contacting to overlap with the connection electrode 326 formed later. The connection electrode contacts to the drain region of the current control TFT consisted of p-channel TFT. In this embodiment, the pixel electrode functions as an anode of the OLED, and is transparent conductive film to pass the light from the OLED to the pixel electrode.

Next, contact hole that reaches to the gate electrode or the conductive layer that is to be the gate wiring and the contact hole that reaches to each impurity region. The plural etching processes are performed sequentially in this embodiment. After the third interlayer insulating film is etched by using the second interlayer insulating film as an etching stopper, the second interlayer insulating film is etched by using the first interlayer insulating film as an etching stopper, thereby the first interlayer insulating film is etched.

After that, the electrodes 320 to 326, specifically, a source wiring, a current supply line, a drawing electrode, and connection electrode are formed by using Al, Ti, Mo, W, and the like. In this embodiment, as the material for these electrodes and wirings may be used a lamination structure consisted of Ti film (having a thickness of 100 nm), Al film containing silicon (having a thickness of 350 nm), and Ti film (having a thickness of 50 nm), and the patterning is performed. Thus, the source electrode or source wiring, the connection electrode, the drawing electrode, the power source supply line, and the like are formed appropriately. The drawing electrode for contacting the gate wiring that is covered by the interlayer insulating film is formed at the periphery of the gate wiring. The input-output terminal portions in which the electrode for connecting the external circuit or the external power source is formed are formed at another periphery portion of each wiring. The connection electrode 326 that is formed to contact and overlap with the pixel electrode 319 formed previously is contacting the drain region of the current control TFT 404.

As mentioned above, the driver circuit having the n-channel TFT 405 having the p-channel TFT 406, and CMOS circuit that is formed by combining complementary these TFTs, and the pixel portion 401 having n-channel TFT 403 or the p-channel TFT 404 in plurality in a pixel can be formed.

When the patterning is completed, heat treatment is performed by removing resists as Embodiment 1, subsequently, the insulator 327 referred to as bank is formed to cover the edge portion of the pixel electrode 319 at both end sides. The bank may be formed by the insulating film or the resin film.

According to Embodiment Mode 1 or 2, a layer containing TFT in which the bonding member 300 that contacts the second material layer 310 is used as a support medium may be obtained.

Next, the EL layer 328 and the cathode 329 of OLED are formed on the pixel electrode that the edge portions thereof are covered by bank according to Embodiment 1.

Figure 5:
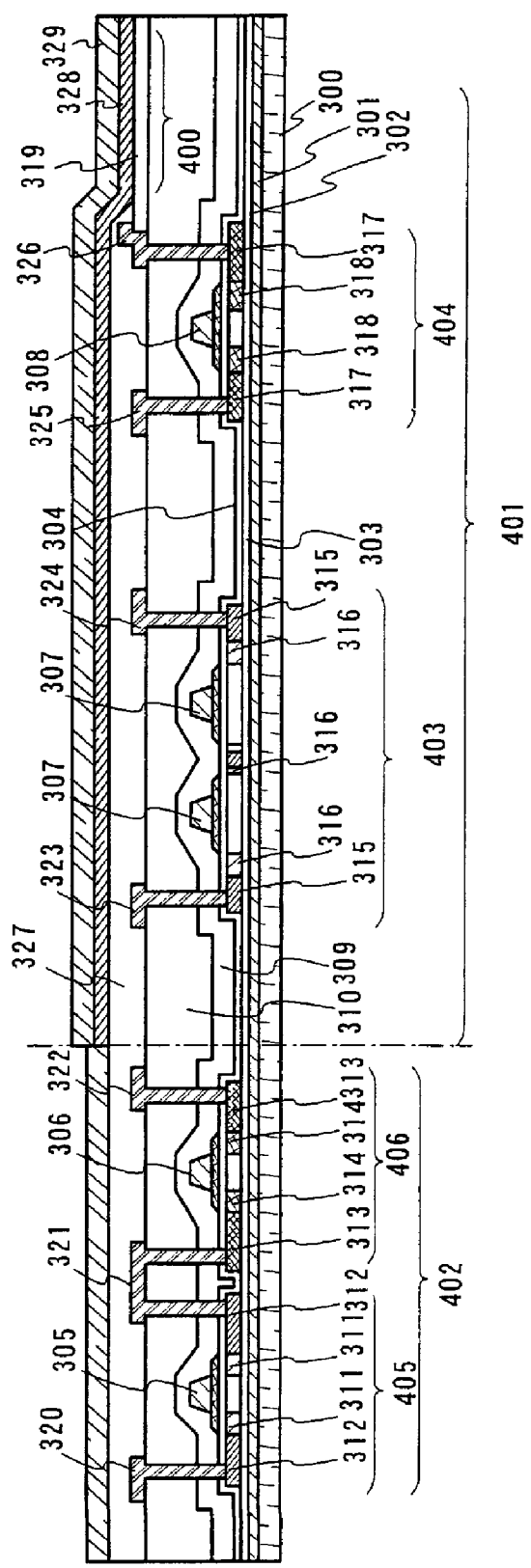
FIG. 5 is a sectional view of a light emitting device having an OLED.

The state up through this step is illustrated in FIG. 5.

The following steps is that OLED is cut off from the outside by sealing OLED having at least the cathode, the organic compound layer, and the anode using an organic resin, a protective film, a sealing substrate, or a sealing can. Thereby it is prevent materials such as water and oxygen that deteriorates EL layer from penetrating into OLED by cutting off OLED completely from outside.

Next, FPC (Flexible Printed Circuit) is stuck to each electrode of input-output terminal portions by using anisotropic conductive materials.

By above-mentioned steps, the module type light emitting device connecting FPC is completed. In the light emitting device of this embodiment, light emitted from OLED passing through only the second bonding member can be seen by viewer. Therefore, it is preferable that the material having light transmitting property is used for the second bonding member.

Embodiment 3

The top surface view and the cross-sectional view of the module type light emitting device (also referred to as EL module) obtained by Embodiment 1 or 2 are shown.

Figure 6A:
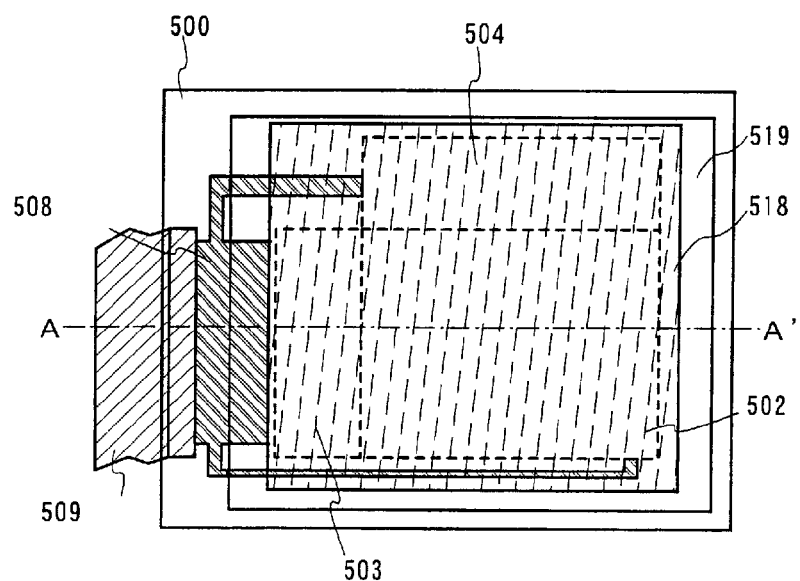
FIGS. 6A and 6B are a top view of a light emitting device having an OLED and a sectional view thereof, respectively.
Figure 6B:
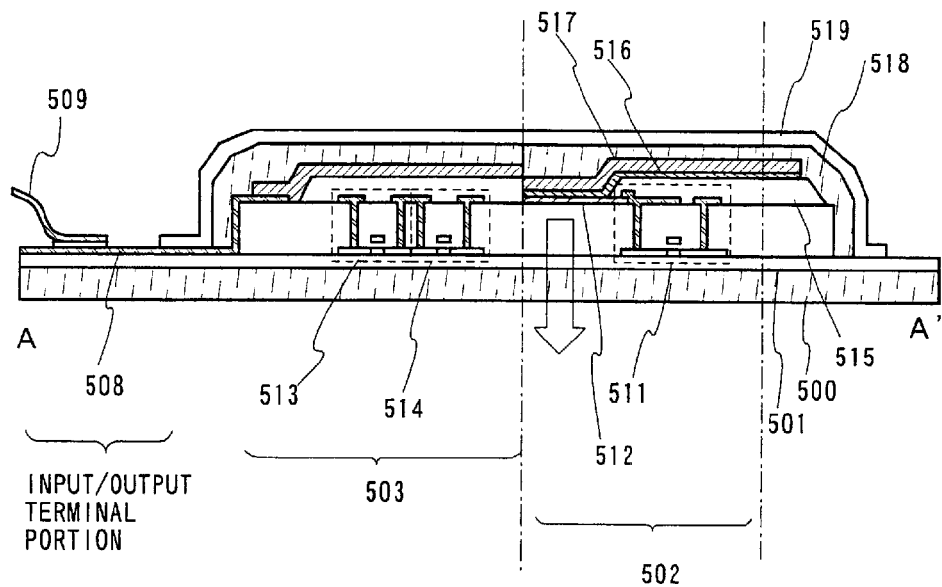

FIG. 6A is a view of a top surface view of EL module and FIG. 6B is a cross-sectional view taken along the line of A-A' of FIG. 6A. FIG. 6A shows that the base insulating film 501 is formed on the bonding member 500 (for example, the second bonding member and the like), and the pixel portion 502, the source side driver circuit 504, and the gate side driver circuit 503 are formed thereon. These pixel portion and driver circuit may be obtained according to above-mentioned Embodiment 1 or 2.

The reference numeral 518 is an organic resin and 519 is a protective film. The pixel portion and the driver circuit portion are covered by the organic resin 518, and the organic resin 518 is covered by the protective film 519. In addition, the organic resin may be sealed by the cover material using the bonding member. The cover material can be adhered as a support medium before peeling-off is subjected.

In addition, reference numeral 508 represents a wiring for transmitting signals to be inputted into the source side driving circuit 504 and the gate side driving circuit 503, and it receives a video signal and a clock signal from the FPC (flexible print circuit) 509 which becomes an external input terminal. In addition, here, only FPC is shown in the figure, but a printed wiring board (PWB) may be attached to this FPC. A light emitting device in the present specification is assumed to contain not only a light emitting device itself but also a state in which FPC or PWB is attached thereto.

The cross-sectional structure shown in FIG. 6B is described. A base insulating film 501 is formed on the bonding member 500. The pixel portion 502 and the gate driving circuit 503 are formed above the insulating film 501. The pixel portion 502 is composed of the current control TFT 511 and plural pixels including the pixel electrode 512 that is connected electrically to the drain of the current control TFT 511. In addition, the gate driving circuit 503 is formed by using a CMOS circuit that is combined with the n-channel TFT 513 and the p-channel TFT 514.

The TFTs (including 511, 513, and 514) may be manufactured according to n-channel TFT of Embodiment 1 and p-channel TFT of Embodiment 1.

After that the pixel portion 502, the source side driver circuit 504, and the gate side driver circuit 503 are formed on the same substrate according to Embodiment 2, only the bonding member 500 is used as a support medium according to Embodiment Mode 1 or 2.

The pixel electrode 512 functions as an anode of the light emitting element (OLED). The bank 515 is formed at the both ends portion of the pixel electrode 512. An organic compound layer 516 and a cathode 517 of the light emitting element are formed on the pixel electrode 512.

As the organic compound layer 516, it should be appreciated that the organic compound layer (a layer for carrying out light emission and movement of carriers therefore) may be formed by freely combining a light emitting layer, an electric charge transport layer or an electric charge injection layer. For example, low molecular series organic compound material and high molecular series organic compound material may be used. Further, as the organic compound layer 516, a thin film which comprises a light emitting material (singlet compound) which emits light by singlet excitation, or a thin film which comprises a light emitting material (triplet compound) which emits light (phosphorous light) by triplet excitation may be used. Furthermore, it is possible to use an inorganic material such as silicon carbide as the electric charge transport layer and the electric charge injection layer. As these organic and inorganic materials, well-know materials can be used.

The cathode 517 functions as a common wiring to all pixels, and is electrically connected to an FPC 509 through a connection wiring 508. Further, elements which are contained in the pixel portion 502 and the gate side driving circuit 503 are all covered by the cathode 517, an organic resin 518 and a protective film 519.

In addition, as the organic resin 518, it is preferable to use a transparent or half transparent material to visible light to the extent possible. Further, it is preferable that the organic resin 518 is a material which does not transmit impurities such as moisture and oxygen to the extent possible.

Also, it is preferred that after the light emitting element has been completely covered with the organic resin 518, the protective film 519 be at least formed on the surface (exposed surface) of the organic resin 518 as shown in FIGS. 6A and 6B. The protective film may be formed on the entire surface including the back surface of the substrate. In such a case, it is necessary to carefully form the protective film so that no protective film portion is formed at the position where the external input terminal (FPC) is provided. A mask may be used to prevent film forming of the protective film at this position. The external input terminal portion may be covered with a tape such as a tape made of Teflon (registered trademark) used as a masking tape in a CVD apparatus to prevent film forming of the protective film. The silicon nitride film, the DLC film, or AlNxOy film may be used as the protective film 519.

The light emitting element constructed as described above is enclosed with the protective film 519 to completely isolate the light emitting element from the outside, thus preventing materials such as water and oxygen which accelerate degradation of the organic compound layer by oxidation from entering from the outside. Also, the film having thermal conductivity enables dissipation of produced heat. Thus, the light emitting device having improved reliability is obtained.

Figure 7:
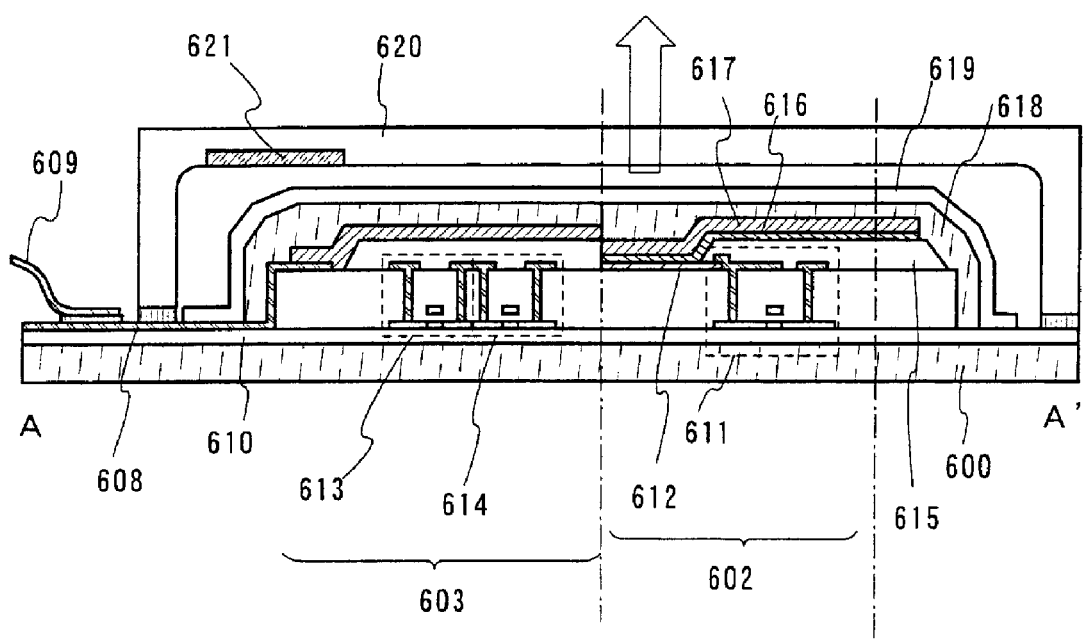
FIG. 7 is a sectional view of a light emitting device having an OLED.

Another arrangement is conceivable in which a pixel electrode is used as a cathode, and an organic compound layer and an anode are formed in combination to emit light in a direction opposite to the direction indicated in FIG. 6B. FIG. 7 shows an example of such an arrangement. The top view thereof is the same as the top view shown in FIG. 6A and will therefore be described with reference to a cross-sectional view only.

The structure shown in the cross-sectional view of FIG. 7 will be described. An insulating film 610 is formed on a bonding member 600, and a pixel portion 602 and a gate-side drive circuit 603 are formed above the insulating film 610. The pixel portion 602 is formed by a plurality of pixels including a current control TFT 611 and a pixel electrode 612 electrically connected to the drain of the current control TFT 611. In addition, only the bonding member 600 is used as a support medium according to Embodiment Mode. A gate side driver circuit 603 is formed by using a CMOS circuit having a combination of an n-channel TFT 613 and a p-channel TFT 614.

These TFTs (611, 613, 614, etc.) may be fabricated in the same manner as the n-channel TFT of Embodiment 1 and the p-channel TFT of Embodiment 1.

The pixel electrode 612 functions as a cathode of the light emitting element (OLED). Banks 615 are formed at opposite ends of the pixel electrode 612, and an organic compound layer 616 and an anode 617 of the light emitting element are formed over the pixel electrode 612.

The anode 617 also functions as a common wiring element connected to all the pixels and is electrically connected to a FPC 609 via connection wiring 608. All the elements included in the pixel portion 602 and the gate-side drive circuit 603 are covered with the cathode 617, an organic resin 618 and a protective film 619. A cover member 620 is bonded to the element layer by an adhesive. A recess is formed in the cover member and a desiccant 621 is set therein.

In the arrangement shown in FIG. 7, the pixel electrode is used as the cathode while the organic compound layer and the anode are formed in combination, so that light is emitted in the direction of the arrow in FIG. 7.

While the top gate TFTs have been described by way of example, the present invention can be applied irrespective of the TFT structure. For example, the present invention can be applied to bottom gate (inverted staggered structure) TFTs and staggered structure TFTs.

Embodiment 4

Figure 8:
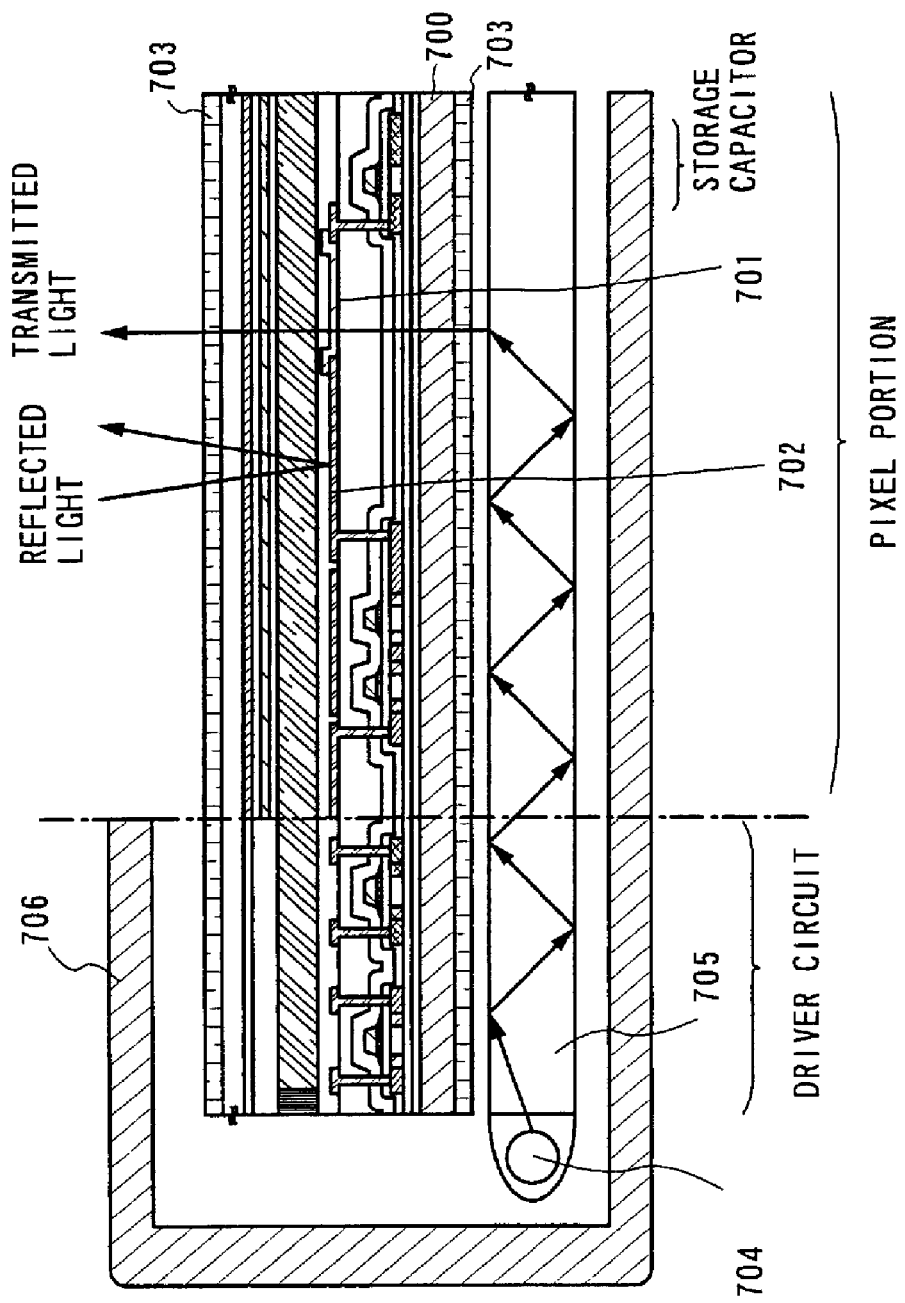
FIG. 8 is a sectional view of an active matrix liquid crystal display device.

This embodiment is an example of a half-transmission type of display device in which pixel electrodes are formed of an conductive film having a light-transmitting property and a metallic material having a reflecting property, as shown in FIG. 8.

In a liquid crystal display device, an n-channel TFT that functions pixel electrodes can be formed according to Embodiment 1 or 2. The step of forming the interlayer insulating layer covering the TFTs and the steps performed before this step are the same as those in Embodiment 1, and the description for them will not be repeated. One of two electrodes in contact with the source region or the drain region of a TFT is formed of a metallic material having a reflecting property to form a pixel electrode (reflecting portion) 702. Subsequently, a pixel electrode (transmitting portion) 701 made of a conductive film having a light-transmitting property is formed so as to overlap the pixel electrode (reflecting portion) 702. As the conductive film having a light-transmitting property, indium-tin oxide (ITO), indium-zinc oxide ($In_2O_2$—ZnO) or zinc oxide (ZnO), for example, may be used.

The pixel TFT is formed on the first substrate as mentioned steps. After the first substrate is peeled off according to Embodiment Mode 1 or 2, a layer containing TFT in which only the bonding member 700 functions as a support medium.

An alignment film is formed and subjected to rubbing treatment. In this embodiment, before the alignment film is formed, an organic resin film such as an acrylic resin film is patterned to form columnar spacers (not illustrated) in desired positions in order to keep the substrates apart. The columnar spacers may be replaced by spherical spacers sprayed onto the entire surface of the substrate.

An opposite substrate functioning as a support medium is prepared next. The opposite substrate has a color filter (not illustrated) in which colored layers and light-shielding layers are arranged with respect to the pixels. A light-shielding layer is also placed in the driving circuit portion. A planarization film is formed to cover the color filter and the light-shielding layer. On the planarization film, an opposite electrode is formed from a transparent conductive film in the pixel portion. An alignment film is formed over the entire surface of the opposite substrate and is subjected to rubbing treatment.

The bonding member 700 in which the pixel portion and the driver circuit are formed and the opposite substrate are adhered together by the sealing material. Into a sealing material, filler is mixed, two sheets of substrates are adhered together with uniform interval by this filler and a spacer in a column shape. Then, between both substrates, a liquid crystal material is implanted and completely sealed with a sealing compound (not shown). A backlight 704 and a light guide plate 705 are provided on the obtained liquid crystal module. The liquid crystal module is thereafter covered with a cover 706. An active-matrix liquid crystal display device such as that partially shown in section in FIG. 8 is thereby completed. The cover and the liquid crystal module are bonded to each other by using an adhesive and an organic resin. When the plastic substrate and the opposed substrate are bonded to each other, a space between the opposed substrate and a frame placed so as to surround the opposed substrate may be filled with the organic resin for bonding. Since the display device is of a half-transmission type, polarizing plates 703 are adhered to both the bonding member 700 and the opposed substrate.

When a sufficient quantity of external light is supplied, the display device is driven as a reflection type in such a manner that while the backlight is maintained in the off state, display is performed by controlling the liquid crystal between the counter electrode provided on the opposed substrate and the pixel electrodes (reflecting portions) 702. When the quantity of external light is insufficient, the backlight is turned on and display is performed by controlling the liquid crystal between the counter electrode provided on the opposed substrate and the pixel electrodes (transmitting portions) 701.

However, if the liquid crystal used is a TN liquid crystal or an STN liquid crystal, the twist angle of the liquid crystal is changed between the reflection type and the transmission type. Therefore, there is a need to optimize the polarizing plate and the phase difference plate. For example, a need arises to separately provide an optical rotation compensation mechanism for adjusting the twist angle of the liquid crystal (e.g., a polarizing plate using a high-molecular weight liquid crystal).

Embodiment 5

The driver circuit and the pixel portion formed by implementing the present invention can be used to various modules (active matrix liquid crystal module, active matrix EL module and active matrix EC module). Namely, all of the electronic equipments are completed by implementing the present invention.

Following can be given as such electronic equipments: video cameras; digital cameras; head mounted displays (goggle type displays); car navigation systems; projectors; car stereos; personal computers; portable information terminals (mobile computers, mobile phones or electronic books etc.) etc. Examples of these are shown in FIGS. 13 to 15.

Figure 13A:
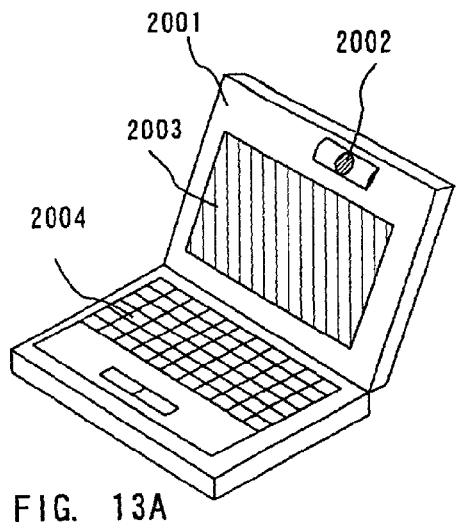
FIGS. 13A to 13F are diagrams showing examples of electronic equipment.
Figure 14:
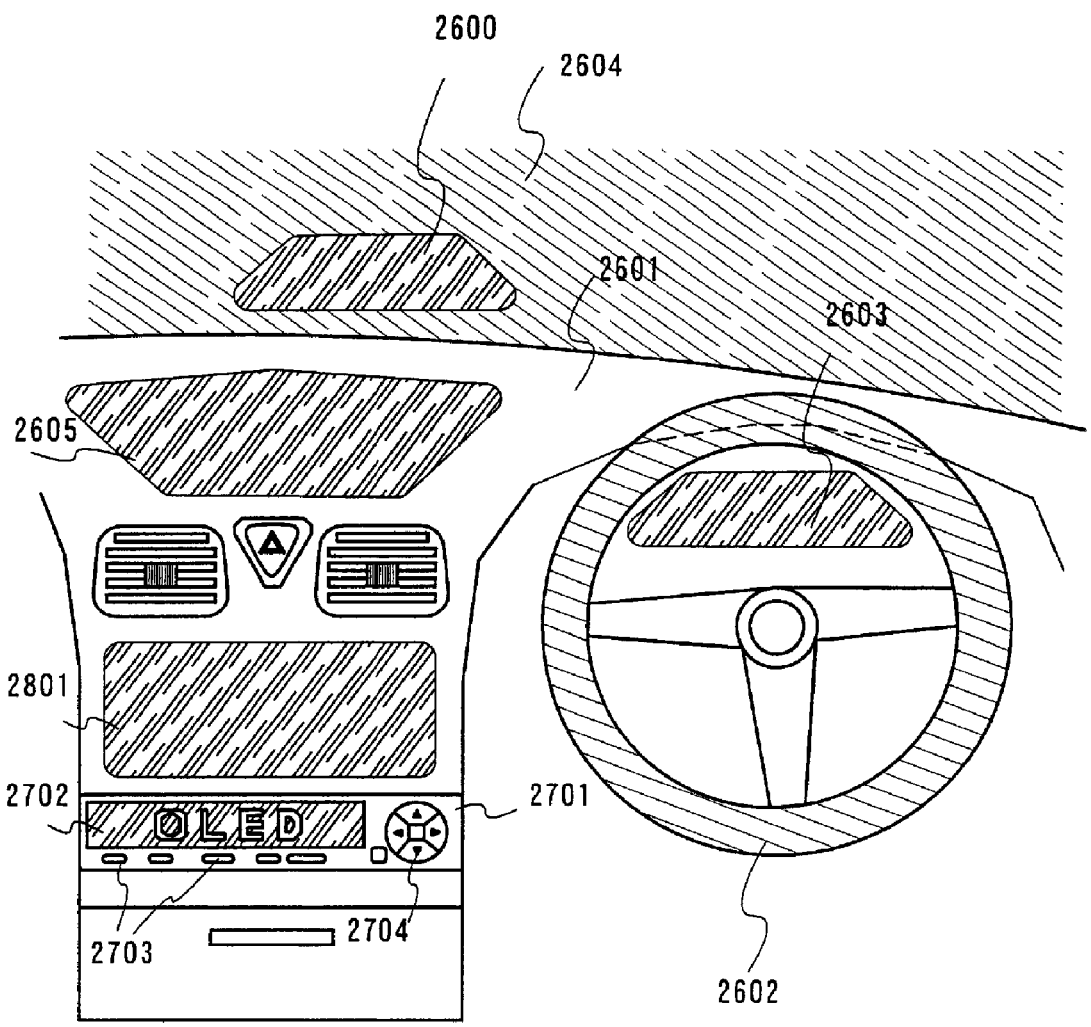
FIG. 14 is a diagram showing examples of electronic equipment.

FIG. 13A is a personal computer which comprises: a main body 2001; an image input section 2002; a display section 2003; and a keyboard 2004 etc.

Figure 13B:
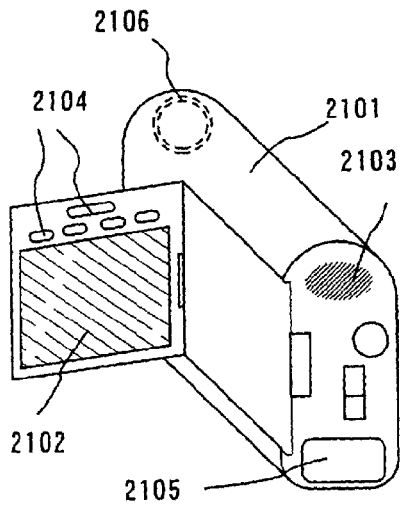

FIG. 13B is a video camera which comprises: a main body 2101; a display section 2102; a voice input section 2103; operation switches 2104; a battery 2105 and an image receiving section 2106 etc.

Figure 13C:
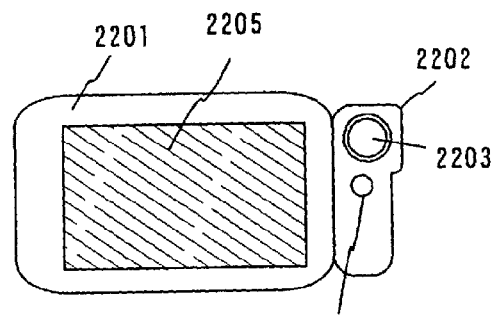

FIG. 13C is a mobile computer which comprises: a main body 2201; a camera section 2202; an image receiving section 2203; operation switches 2204 and a display section 2205 etc.

Figure 13D:
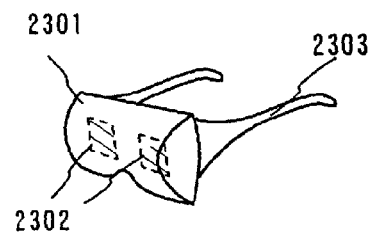

FIG. 13D is a goggle type display which comprises: a main body 2301; a display section 2302; and an arm section 2303 etc.

Figure 13E:
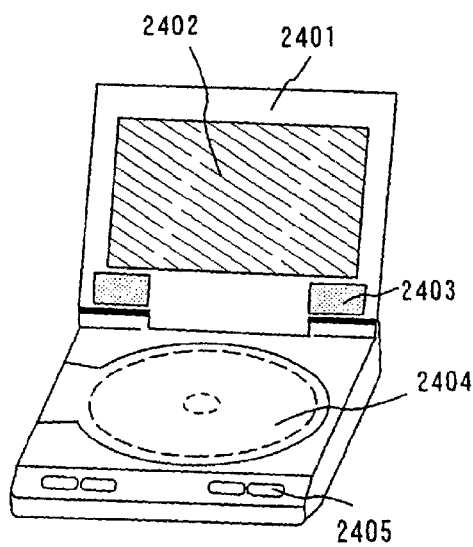

FIG. 13E is a player using a recording medium in which a program is recorded (hereinafter referred to as a recording medium) which comprises: a main body 2401; a display section 2402; a speaker section 2403; a recording medium 2404; and operation switches 2405 etc. This apparatus uses DVD (digital versatile disc), CD, etc. for the recording medium, and can perform music appreciation, film appreciation, games and use for Internet.

Figure 13F:
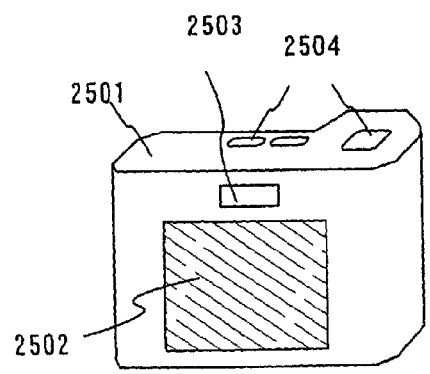

FIG. 13F is a digital camera which comprises: a main body 2501; a display section 2502; a view finder 2503; operation switches 2504; and an image receiving section (not shown in the figure) etc.

FIG. 14 is a figure showing a driver's seat area. The sound reproduction device, specifically, a car audio and a car navigation are provided in a dash board. A main body 2701 of the car audio comprises; the display portion 2702, operation switches 2703 and 2704. By applying the present invention to the display portion 2702, thin and light-weight car audio can be obtained. And by applying the present invention to the display portion 2801 of the car navigation system, thin and light-weight car navigation system can be obtained.

In an operation handle portion 2602, the display portion 2603 that digitally displays of the speed meter instruments is formed in the dashboard 2601. by applying the present invention to the display portion 2702, thin and light-weight display device of machines can be obtained.

In addition, a display portion 2605 pasted on the curved face of the dashboard portion 2601 may be formed. By applying the present invention to the display portion 2605, thin and light-weight display portion of machines or image display device can be obtained.

Further, the display portion 2600 pasted on the curved face of the front glass 2604 may be formed. In the case that the present invention is applied to the display portion 2600, materials having light transmitting property may be used. Thin and light-weight display device of machines or image display device can be obtained. In this embodiment, though the front glass is used, another window glass can be obtained.

In this embodiment, although a car mounted audio and a car navigation are shown, this embodiment can be used to another display device or fixed type audio and navigation device.

Figure 15A:
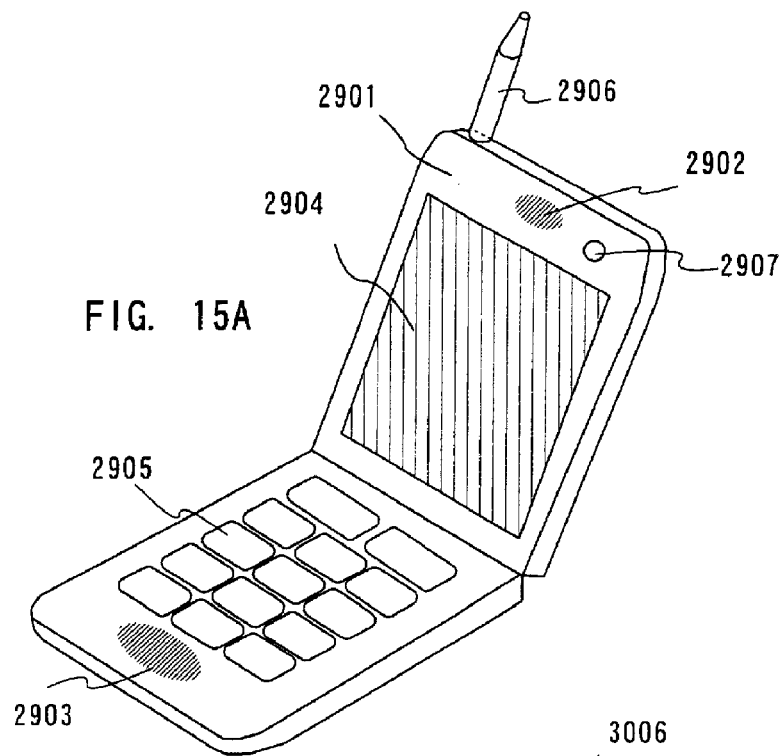
FIGS. 15A to 15C are diagrams showing examples of electronic equipment.

FIG. 15A is a mobile phone which comprises: a main body 2901; a voice output section 2902; a voice input section 2903; a display portion 2904; operation switches 2905; an antenna 2906; and an image input section (CCD, image sensor, etc.) 2907 etc.

Figure 15B:
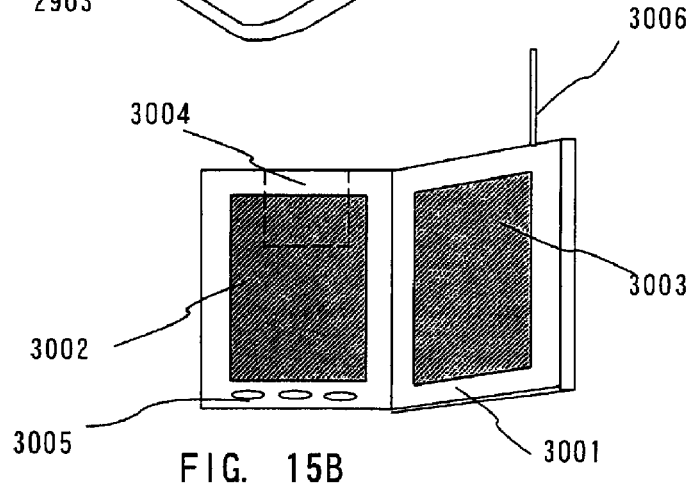

FIG. 15B is a portable book (electronic book) which comprises: a main body 3001; display portions 3002 and 3003; a recording medium 3004; operation switches 3005 and an antenna 3006 etc.

Figure 15C:
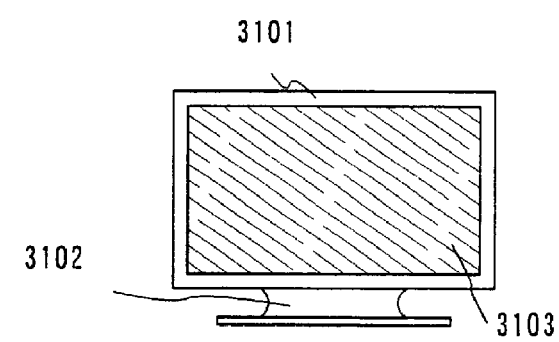
Figure 16A:
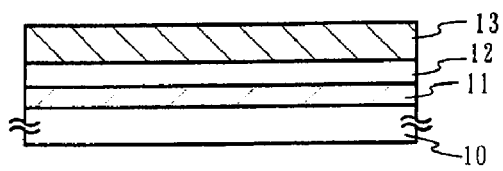
FIGS. 16A to 16G are a process diagram example showing the present invention.
Figure 16B:
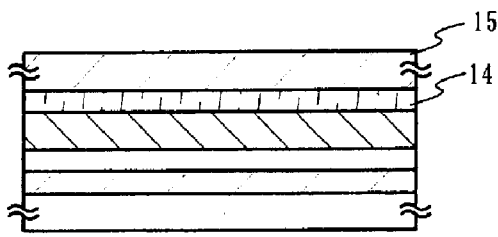
Figure 16C:
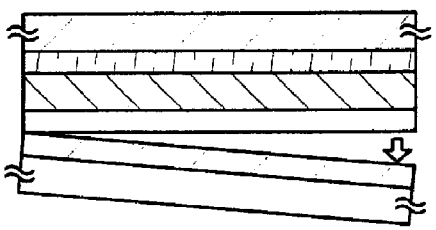
Figure 16D:
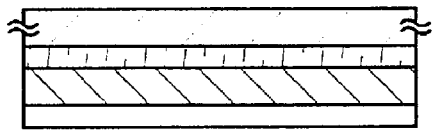
Figure 16E:
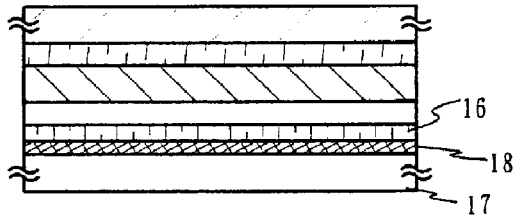
Figure 16F:
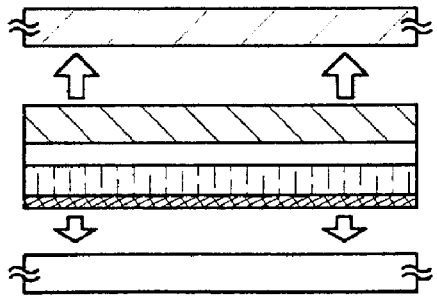
Figure 16G:
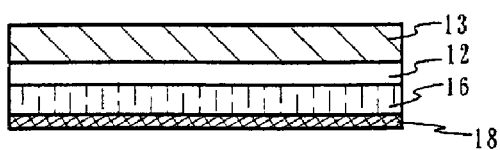

FIG. 15C is a display which comprises: a main body 3101; a supporting section 3102; and a display portion 3103 etc.

In addition, the display shown in FIG. 15C has small and medium-sized or large-sized screen, for example a size of 5 to 20 inches. Further, to manufacture the display part with such sizes, it is preferable to mass-produce by gang printing by using a substrate with one meter on a side.

As described above, the applicable range of the present invention is extremely large, and the invention can be applied to electronic equipments of various areas. Note that the electronic devices of this embodiment can be achieved by utilizing any combination of constitutions in Embodiments 1 to 4.

Embodiment 6

In this embodiment, an example of using an electrophoresis display device as display portions illustrated in Embodiment 5. Typically, the electrophoresis display device is applied to a display portion 3002 or a display portion 3003 of a portable book (electronic book) shown in FIG. 15B.

The electrophoresis display device is also referred to as an electronic paper. It has advantages of readability that is the same as papers, a low power consumption in comparison with other display devices, and shape of thin and light.

The electrophoresis display device can takes a various forms such as that the plural micro capsules containing the first particle with plus electric charge and the second particle with minus electric charge is dispersed in the solvent or solute. By applying electric field to the micro capsule, particles in the micro capsule is removed inversed direction each other so that the color of particles gathered one side are emitted. In addition, the first particle and the second particle contain dyestuffs. The particles do not remove without electric field. Further, the color of the first particle and the second particle are different each other (including colorless).

Thus, the electrophoresis display device uses so-called dielectric migration effect that high dielectric invariable materials are moving to high electric field region. The electrophoresis display device is not necessary a reflection plate and a opposite substrate that are necessary for a liquid crystal display device so that the thickness and weight are reduced by half.

Dispersed micro capsules in solvent is referred to as an electronic ink. The electronic ink can be printed on a surface of a glass, a plastic, a cloth and a paper. Further, a color display is possible by using particles having a color filter and a pigment.

An active matrix type display device can be completed by providing appropriately above-mentioned plural micro capsules between two electrodes. If an electric field is applied to the micro capsule, the device can display images.

The first particle and the second particle in the micro capsule can be formed by one kind of materials or compound materials selected from the following materials; conductive materials, insulating materials, semiconductor materials, magnetism materials, liquid crystal materials, ferroelectric materials, electro luminescent materials, electrochromic materials, and magnetic electrophoresis materials.

This embodiment can be freely combined with Embodiment Modes 1 to 3 and Embodiments 1 to 5.

Embodiment 7

Figure 17:
FIG. 17 is a photographic diagram showing an external view of a panel.
Figure 18:
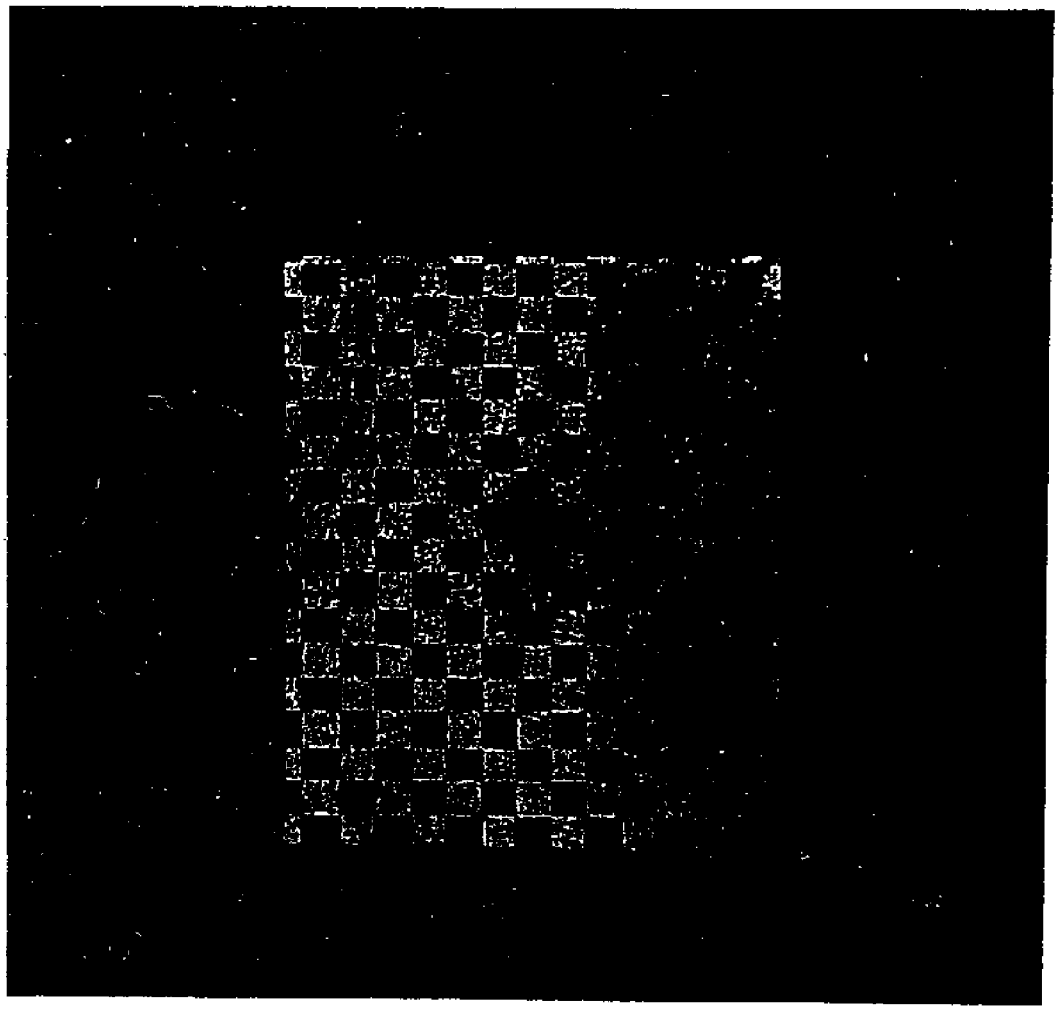
FIG. 18 is a photographic diagram showing the panel emitting a light.

FIGS. 17 and 18 are photographic diagrams of an organic light emitting element of the active matrix type formed by using the present invention.

FIG. 17 is a photographic diagram showing an external view of a bended state of thin organic light emitting module that is formed according to Embodiment Mode 3. The module shown in FIG. 17 has a structure of sandwiched by polycarbonate plastic substrates. Between a pair of plastic substrates, the cathode, the anode, the plural light emitting elements having layers sandwiching organic compounds by the cathode and the anode, and TFT for driving the light emitting elements are formed. Other substrate is fixed to a base film of TFT (silicon oxide film formed by sputtering) by adhesive, and another substrate is also fixed to the cathode of the light emitting element by adhesive.

The display region is configured by providing a matrix of the plural light emitting elements. The driving circuits for driving these light emitting elements are provided at the periphery of the display device. In this embodiment, the green luminescent light emitting element is manufactured for displaying the luminescence. FIG. 18 is a display view of the luminescence.

In this embodiment, a pair of plastic substrates are used to fix the light emitting element, however, it is not limited thereof. If the mechanical strength and sealing of the light emitting element is sufficient, either substrate or both substrates are not needed.

This embodiment can be freely combined with any of Embodiment Modes 1 to 3 and Embodiments 1 to 6.

According to the present invention, a semiconductor device having an element (a thin film transistor, a light emitting device with an OLED, an element with liquid crystal, a memory element, a thin film diode, a photoelectric conversion element of silicon PIN junction, or a silicon resistor element) which is light-weight, flexible (bendable), and thin as a whole is obtained as well as a method of manufacturing the semiconductor device.

What is claimed is:

1. A method of manufacturing a semiconductor device, comprising steps of:
   forming a peeled layer over a first substrate;
   bonding a second substrate to the peeled layer using a first bonding member to sandwich the peeled layer between the first substrate and the second substrate;
   separating at least the first substrate from the peeled layer;
   bonding a third substrate to the peeled layer using a second bonding member to sandwich the peeled layer between the second substrate and the third substrate;
   separating at least the second substrate from the peeled layer; and
   separating the third substrate from the peeled layer while the second bonding member remains as a supporter.

2. A method according to claim 1, wherein the peeled layer includes at least a transistor.

3. A method according to claim 1, wherein the first bonding member is a photosensitive bonding member.

4. A method according to claim 1, wherein the first bonding member is a photosensitive bonding member and the second substrate is separated from the peeled layer by irradiating the first bonding member with light.

5. A method according to claim 1, wherein the second substrate is separated from the peeled layer by dissolving the first bonding member in a solvent.

6. A method according to claim 1, wherein the second bonding member is a photosensitive bonding member.

7. A method according to claim 1, wherein the second bonding member is a photosensitive bonding member and the third substrate is separated from the peeled layer by irradiating the second bonding member with light.

8. A method according to claim 1, wherein the third substrate is separated from the peeled layer by dissolving the second bonding member in a solvent.

9. A method according to claim 1, wherein the second bonding member adheres to the peeled layer at a stronger adhesion than its adhesion to the third substrate.

10. A method according to claim 1, wherein the first substrate is one selected from the group consisting of a glass substrate, a quartz substrate, and a metal substrate.

11. A method according to claim 1, wherein the second substrate is one selected from the group consisting of a glass substrate, a quartz substrate, and a metal substrate.

12. A method according to claim 1, wherein the third substrate is a plastic substrate.

13. A method according to claim 1, wherein the third substrate is a plastic film with a film that contains aluminum, oxygen and nitrogen formed on its surface.

14. A method of manufacturing a semiconductor device, comprising steps of:
   forming a peeled layer over a first substrate;
   bonding a second substrate to the peeled layer with a first bonding member interposed therebetween so as to sandwich the peeled layer between the first substrate and the second substrate;
   separating at least the first substrate from the peeled layer;
   bonding a third substrate to the peeled layer with a second bonding member interposed therebetween so as to sandwich the peeled layer between the second substrate and the third substrate;
   separating at least the second substrate from the peeled layer; and
   separating the third substrate from the peeled layer while the second bonding member remains as a supporter.

15. A method according to claim 14, wherein the peeled layer includes at least a transistor.

16. A method according to claim 14, wherein the first bonding member is a photosensitive bonding member.

17. A method according to claim 14, wherein the first bonding member is a photosensitive bonding member and the second substrate is separated from the peeled layer by irradiating the first bonding member with light.

18. A method according to claim 14, wherein the second substrate is separated from the peeled layer by dissolving the first bonding member in a solvent.

19. A method according to claim 14, wherein the second bonding member is a photosensitive bonding member.

20. A method according to claim 14, wherein the second bonding member is a photosensitive bonding member and the third substrate is separated from the peeled layer by irradiating the second bonding member with light.

21. A method according to claim 14, wherein the third substrate is separated from the peeled layer by dissolving the second bonding member in a solvent.

22. A method according to claim 14, wherein the second bonding member adheres to the peeled layer at a stronger adhesion than its adhesion to the third substrate.

23. A method according to claim 14, wherein the first substrate is one selected from the group consisting of a glass substrate, a quartz substrate, and a metal substrate.

24. A method according to claim 14, wherein the second substrate is one selected from the group consisting of a glass substrate, a quartz substrate, and a metal substrate.

25. A method according to claim 14, wherein the third substrate is a plastic substrate.

26. A method according to claim 14, wherein the third substrate is a plastic film with a film that contains aluminum, oxygen and nitrogen formed on its surface.

* * * * *